United States Patent [19]

Hartmann et al.

[11] Patent Number: 4,617,479
[45] Date of Patent: Oct. 14, 1986

[54] PROGRAMMABLE LOGIC ARRAY DEVICE USING EPROM TECHNOLOGY

[75] Inventors: Robert F. Hartmann, San Jose; Sau-Ching Wong, Hillsborough; Yiu-Fai Chan, Saratoga; Jung-Hsing Ou, Sunnyvale, all of Calif.

[73] Assignee: Altera Corporation, Santa Clara, Calif.

[21] Appl. No.: 607,018

[22] Filed: May 3, 1984

[51] Int. Cl.$^4$ .................. G06F 7/00; H03K 19/177; H03K 19/20; H03K 19/094

[52] U.S. Cl. .................................. 307/465; 307/468; 307/473; 307/475; 340/825.83; 364/716; 364/900

[58] Field of Search ............... 307/465, 468, 469, 473, 307/475; 340/825.83; 364/716, 900 MS File; 365/94, 103, 104, 184, 185

[56] References Cited

U.S. PATENT DOCUMENTS

| | | | |
|---|---|---|---|
| 3,566,153 | 2/1971 | Spencer, Jr. ...................... | 307/468 |
| 3,987,287 | 10/1976 | Cox et al. ........................ | 364/716 X |
| 4,132,979 | 1/1979 | Heeren ............................. | 364/900 X |
| 4,336,601 | 6/1982 | Tanaka ............................. | 307/465 X |
| 4,366,393 | 12/1982 | Kasuya ............................. | 307/465 X |
| 4,422,072 | 12/1983 | Cavlan ............................. | 307/465 X |
| 4,488,246 | 12/1984 | Brice ................................ | 340/825.83 X |

OTHER PUBLICATIONS

Wood, "High-Speed Dynamic Programmable Logic Array Chip"; *IBM J. Res. Develop.*; 7/1975; pp. 379-383.

*Primary Examiner*—Larry N. Anagnos
*Attorney, Agent, or Firm*—Hamrick, Hoffman, Guillot & Kazubowski

[57] ABSTRACT

The programmable logic array device basically comprises a programmable AND array (FIGS. 5, 11) having a plurality of memory cells (30, 31) arranged in addressable rows (40-45) and columns (32-38) and which can be individually programmed to contain logic data; an input circuit (FIG. 9) for receiving an input signal and for developing a buffered signal corresponding thereto; a first row driver (FIG. 10) responsive to the buffered signal and operative to interrogate a particular row of the memory cells and to cause the AND array to output signals corresponding to the data contained therein; first sensing circuitry (FIG. 12) for sensing the signals output by the AND array and for developing corresponding data signals which are the logical OR of signals output by the AND array; first output terminal circuitry; and first switching circuitry (FIG. 14) responsive to a control signal and operative to couple the data signal either into the storage circuitry or to the output terminal circuitry (FIG. 16). The device has the advantages generally of greater logic density and lower system power than standard family logic components.

27 Claims, 27 Drawing Figures

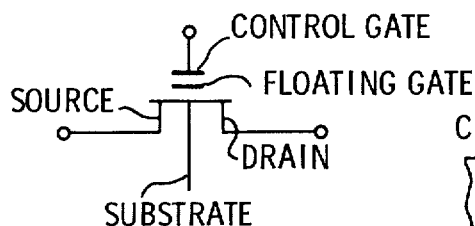
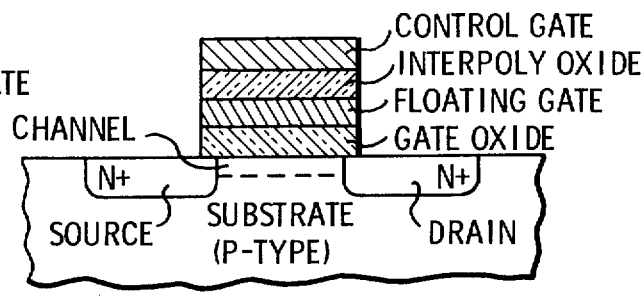
Fig_1   Fig_2
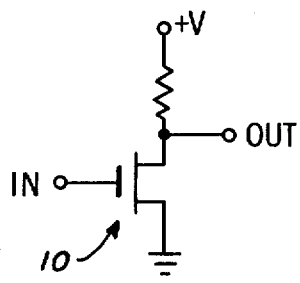
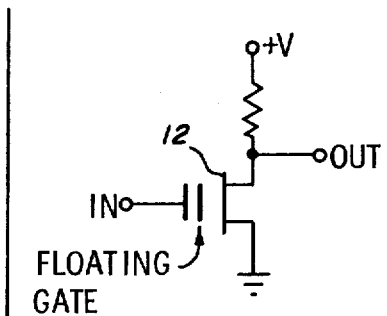
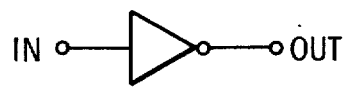
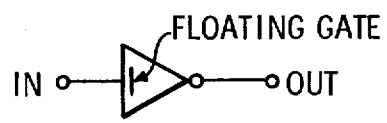
| IN | OUT |
|---|---|
| +V | 0 |
| 0 | +V |
| IN | FLOATING GATE | OUT |
|---|---|---|
| +V | UNPROGRAMMED | 0 |
| 0 | UNPROGRAMMED | +V |
| X | PROGRAMMED | +V |
(X MEANS EITHER 0 OR +V)
(a)   Fig_3   (b)

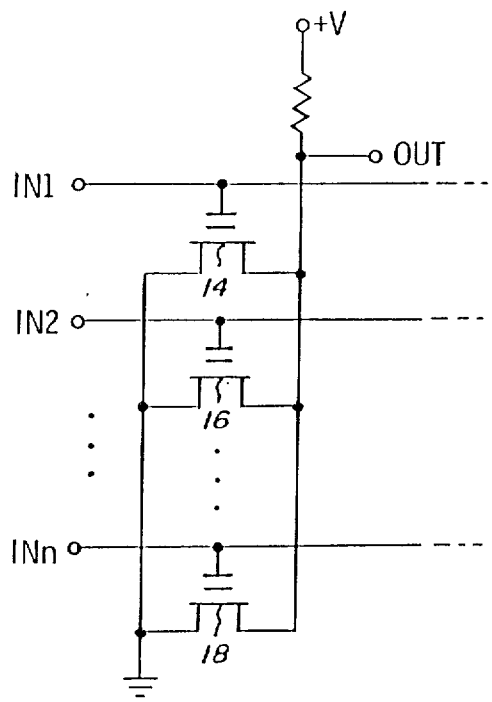
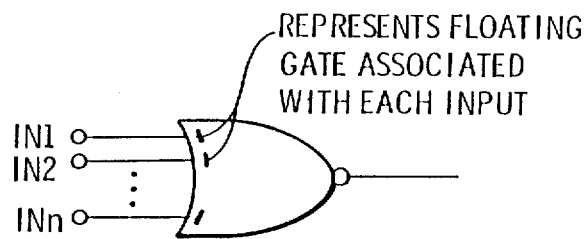
(a) SCHEMATIC DIAGRAM     (b) LOGIC DIAGRAM
| IN1 | IN2 | INn | OUT | |
|---|---|---|---|---|
| 0 | 0 | 0 | 1 | |
| X | X | 1 | 0 | |
| X | 1 | X | 0 | |
| 1 | X | X | 0 | |
| X(P) | 0 | 0 | 1 | |
| X(P) | 1 | X | 0 | IN1 GATE IS PROGRAMMED |
| X(P) | X | 1 | 0 | |
| 0 | X(P) | 0 | 1 | |
| 1 | X(P) | X | 0 | IN2 GATE IS PROGRAMMED |
| X | X(P) | 1 | 0 | |
| 0 | 0 | X(P) | 1 | |
| 1 | X | X(P) | 0 | INn GATE IS PROGRAMMED |
| X | 1 | X(P) | 0 | |
Note: P in the Truth Table means that the EPROM transistor at that site is programmed. X means either 1 or 0.
(c) TRUTH TABLE
Fig_4

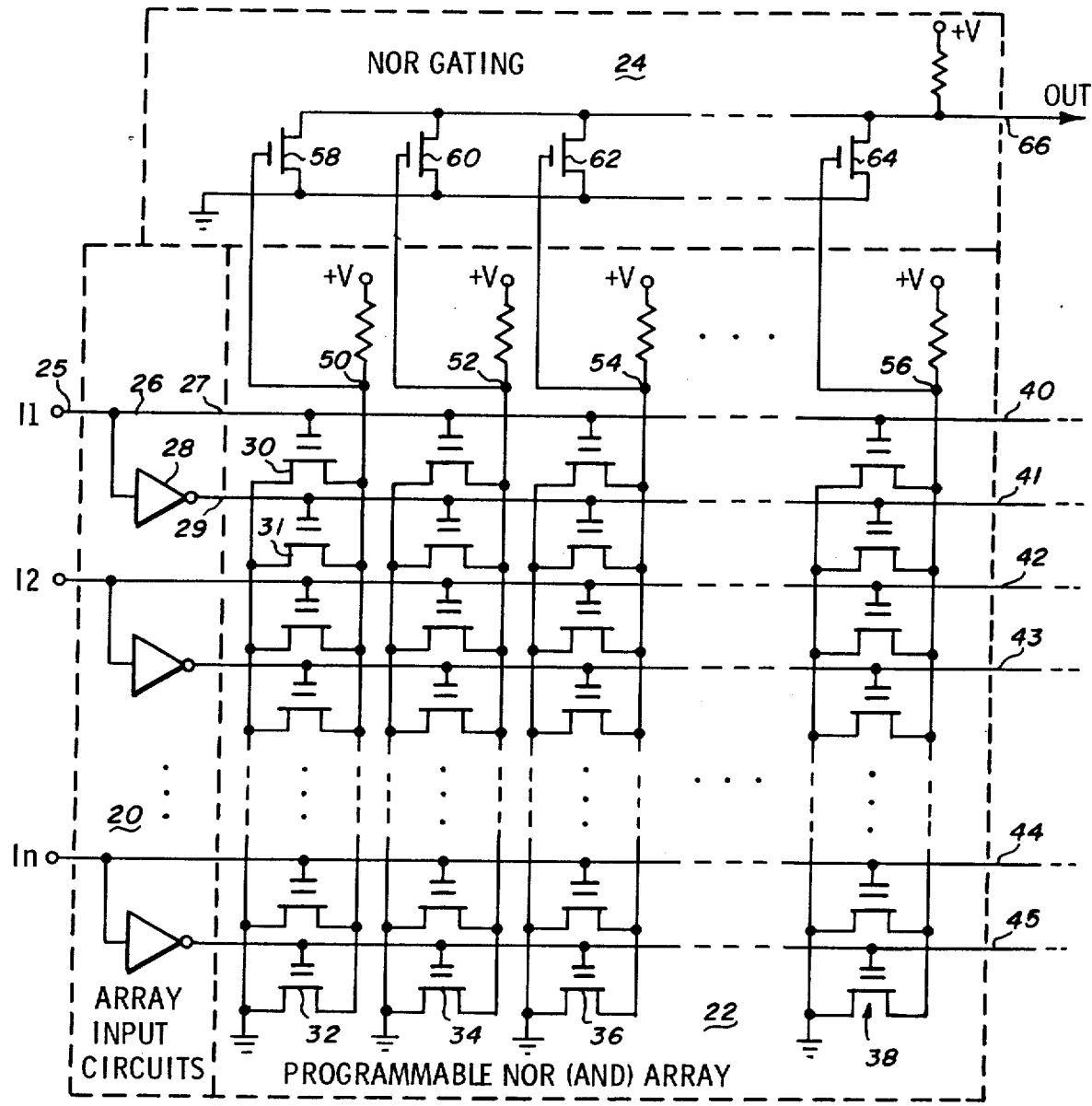
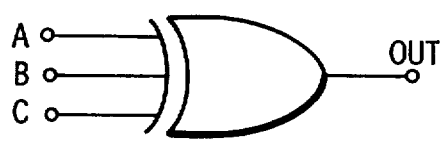
Fig_6
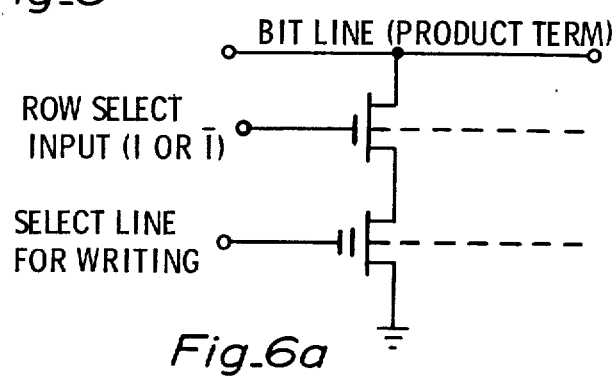
Fig_6a

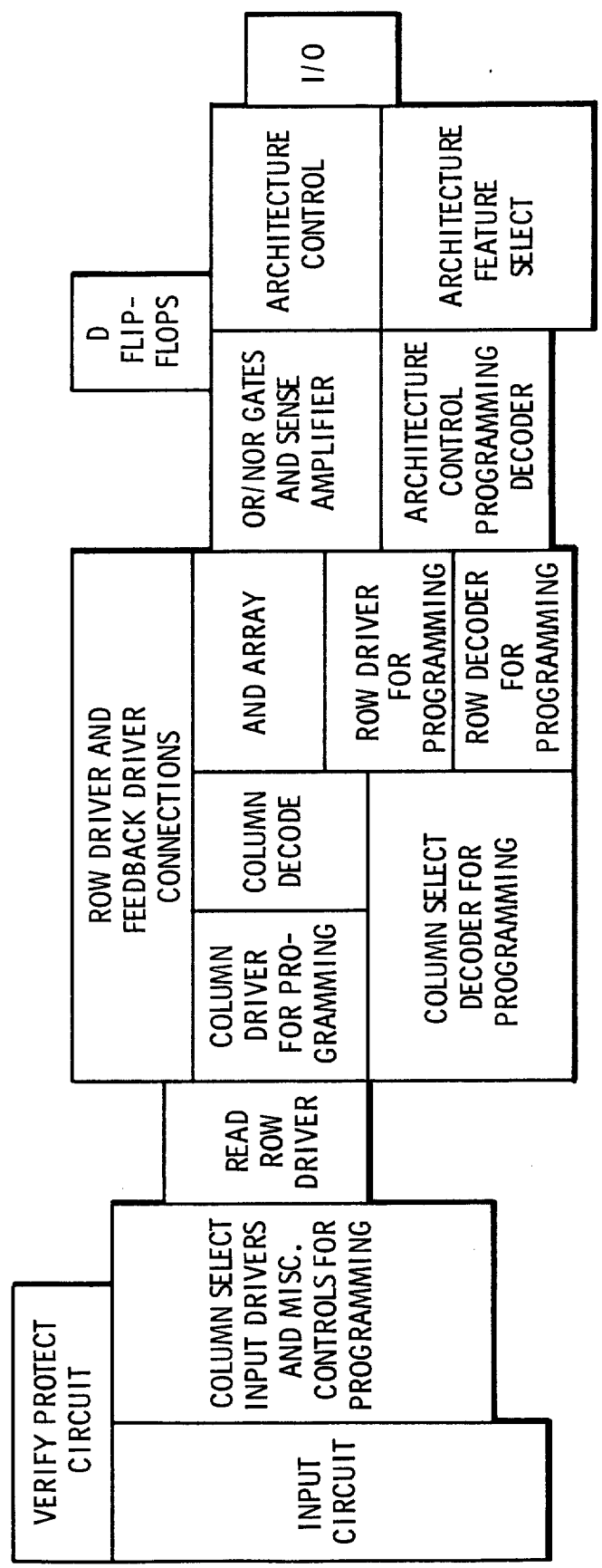
Fig_7

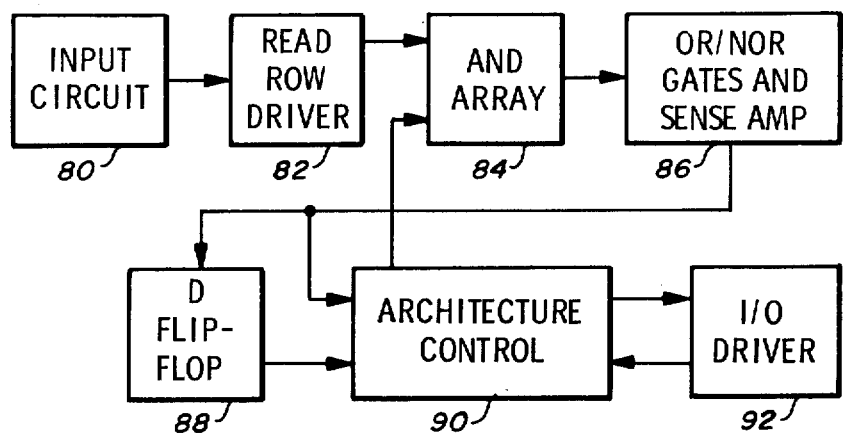
Fig_8A
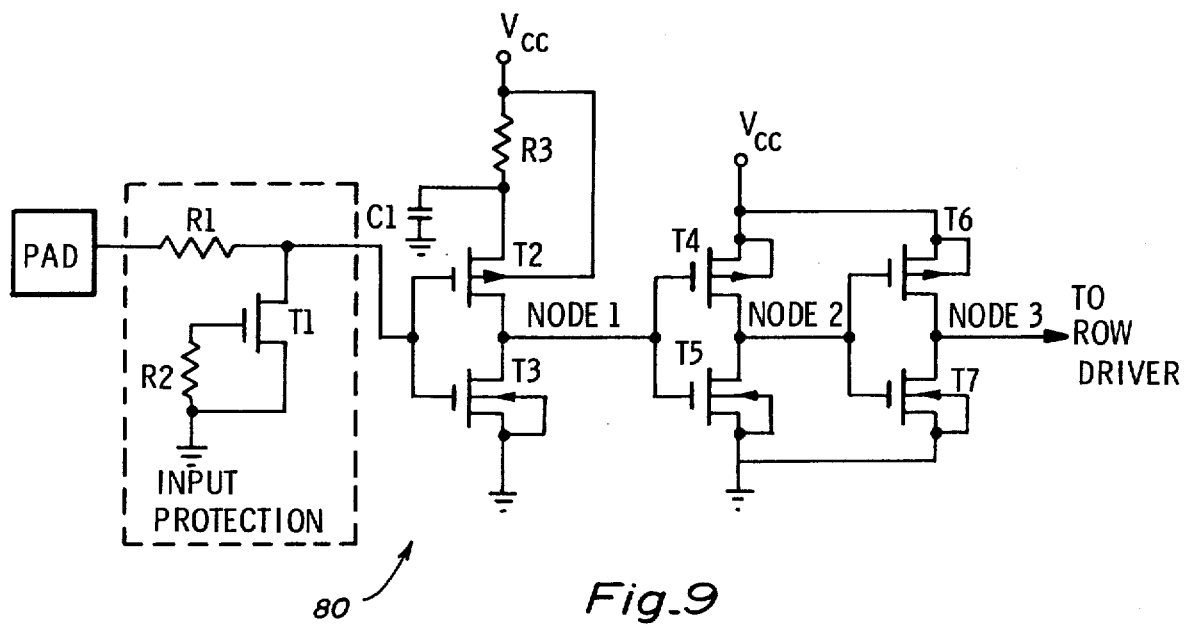
Fig_9

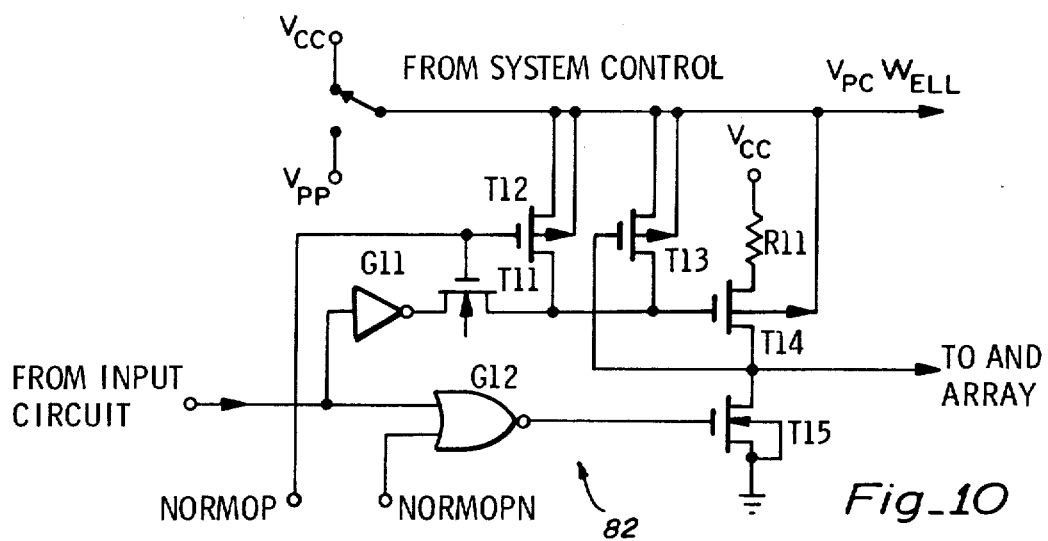
Fig_10
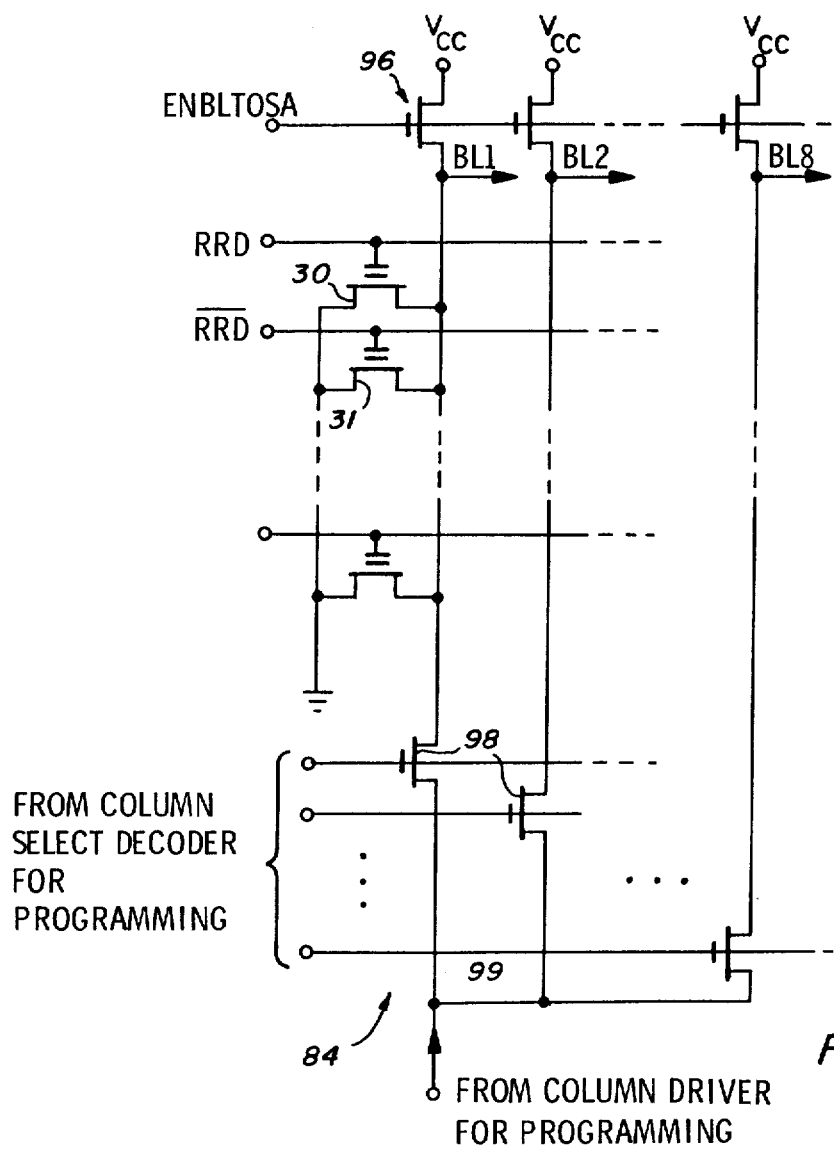
Fig_11

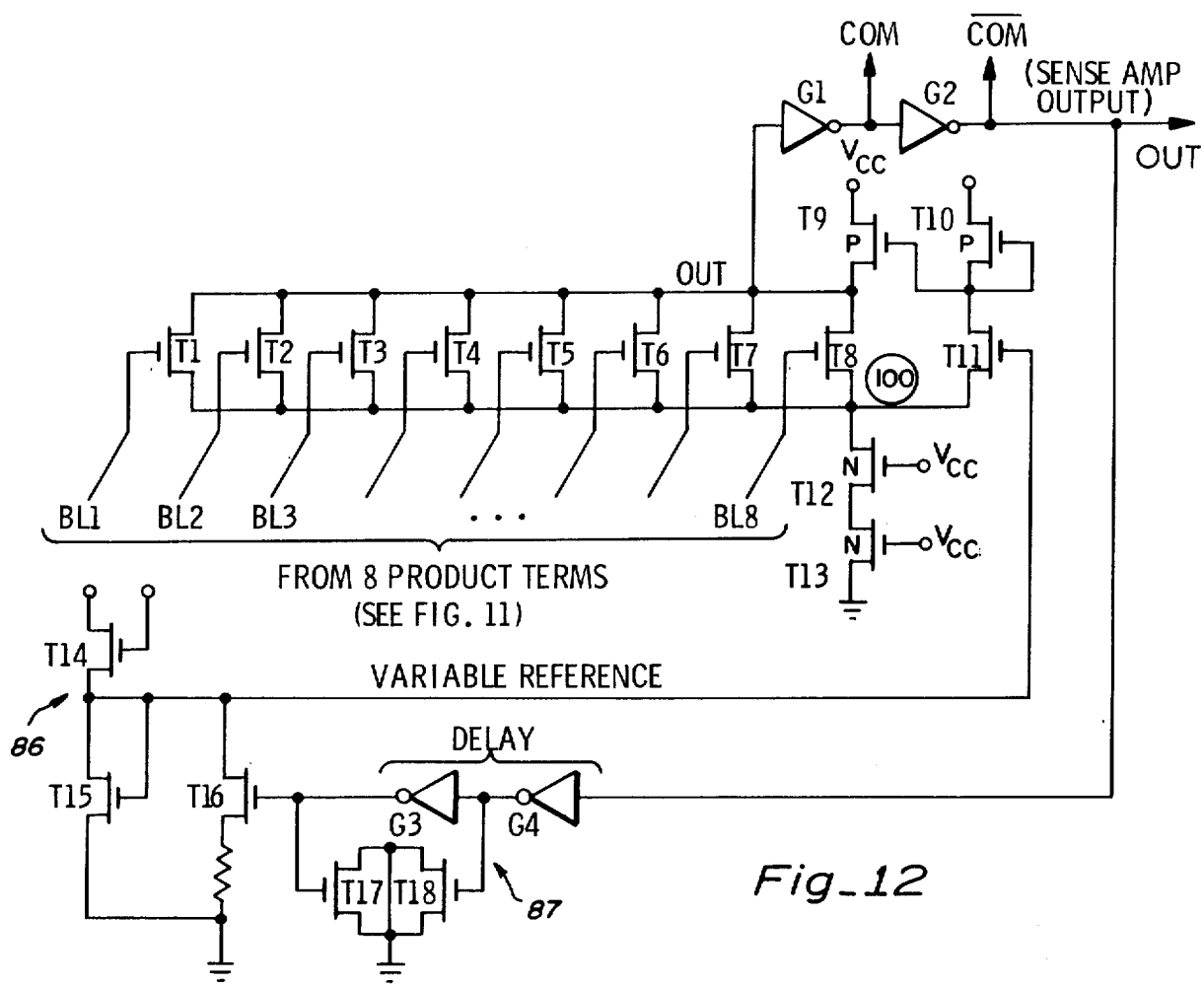
Fig_12
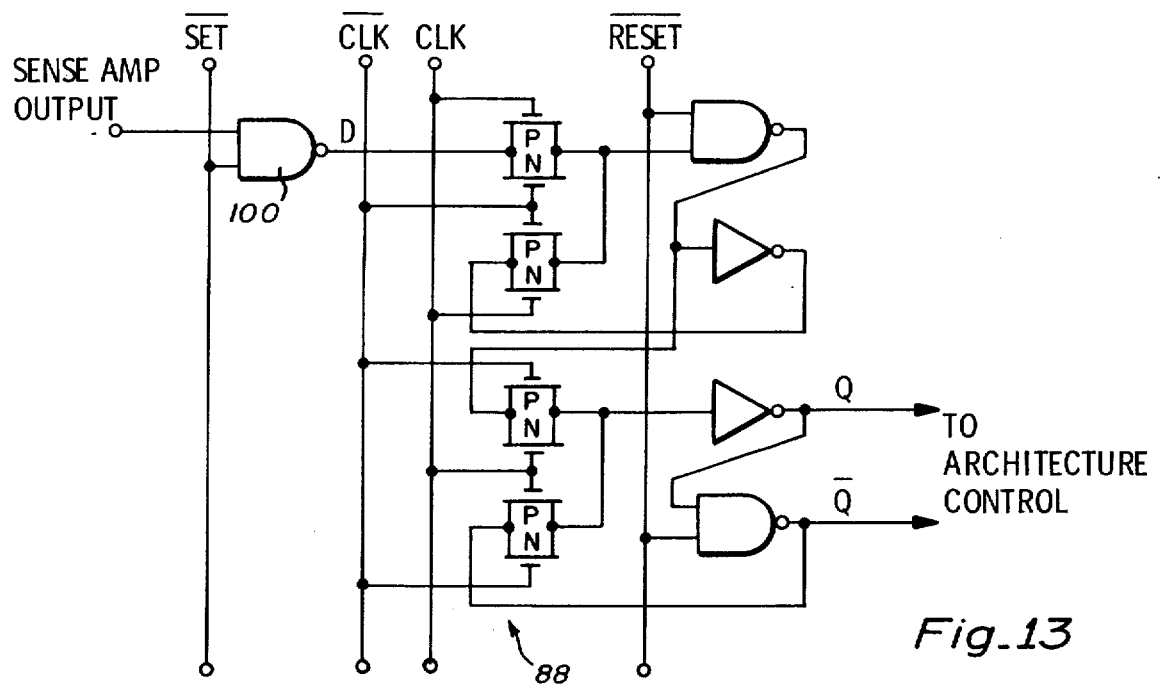
Fig_13

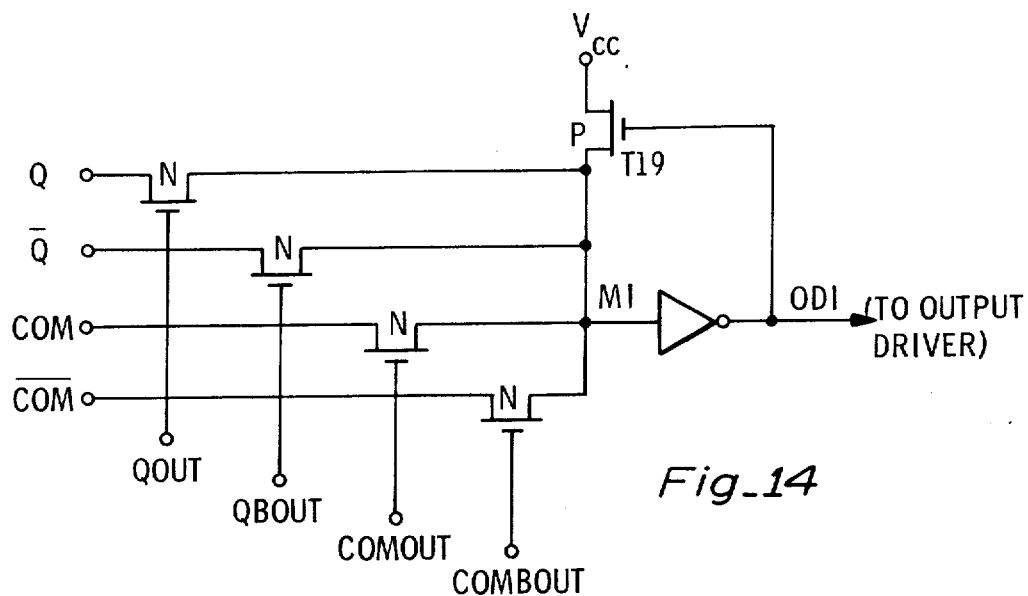
Fig_14
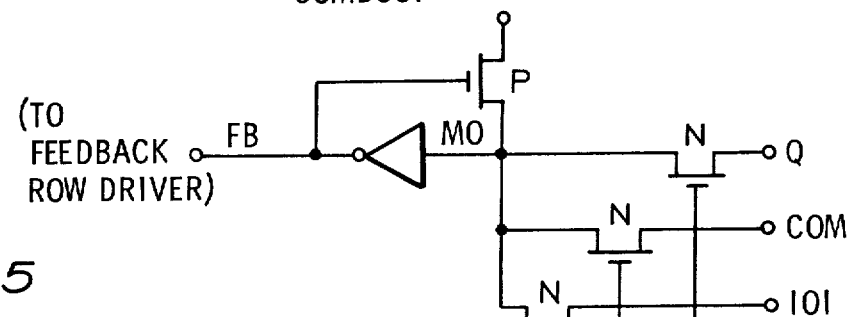
Fig_15
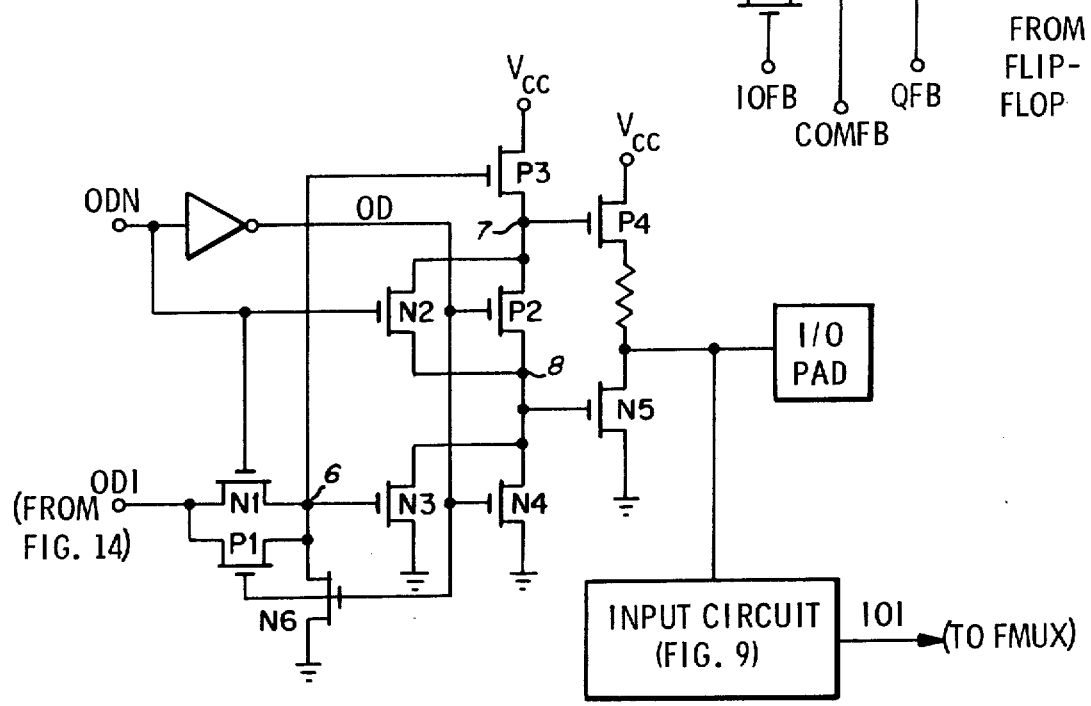
Fig_16

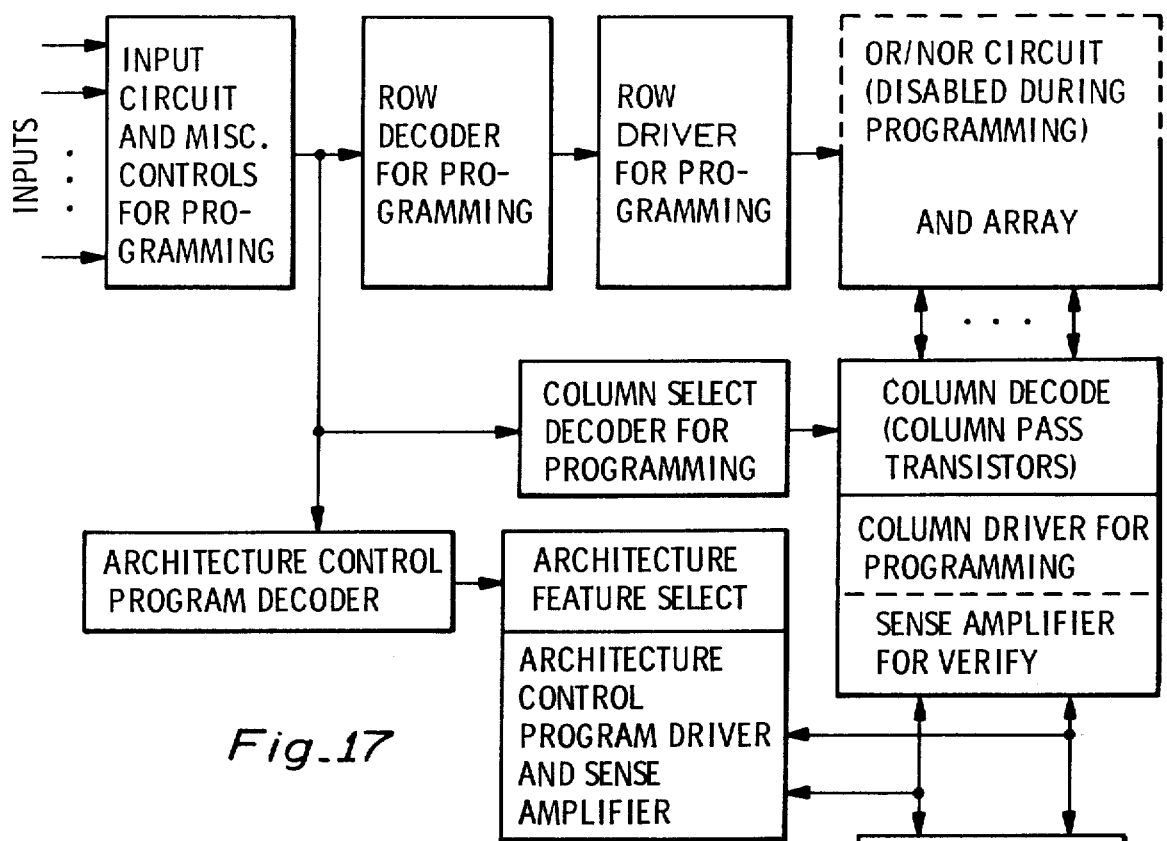
Fig_17
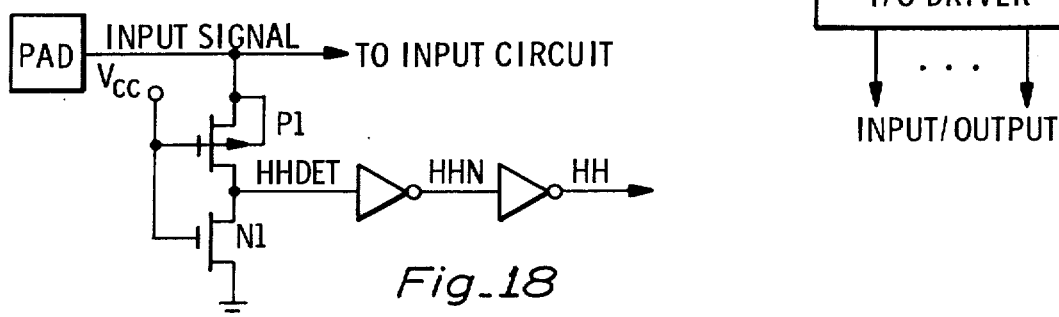
Fig_18
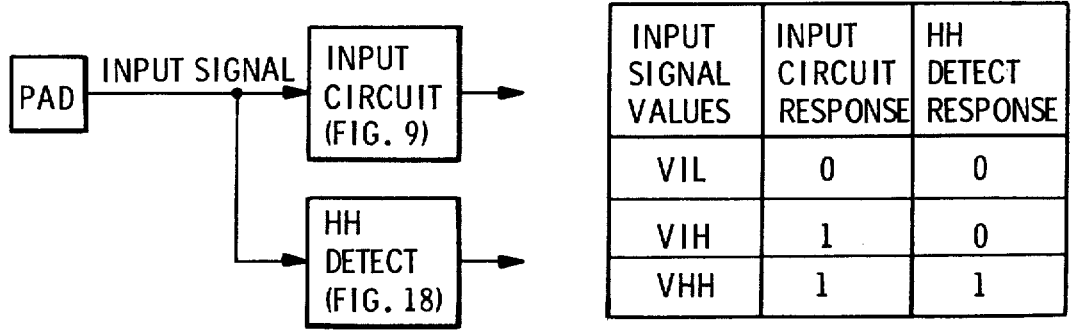
Fig_19

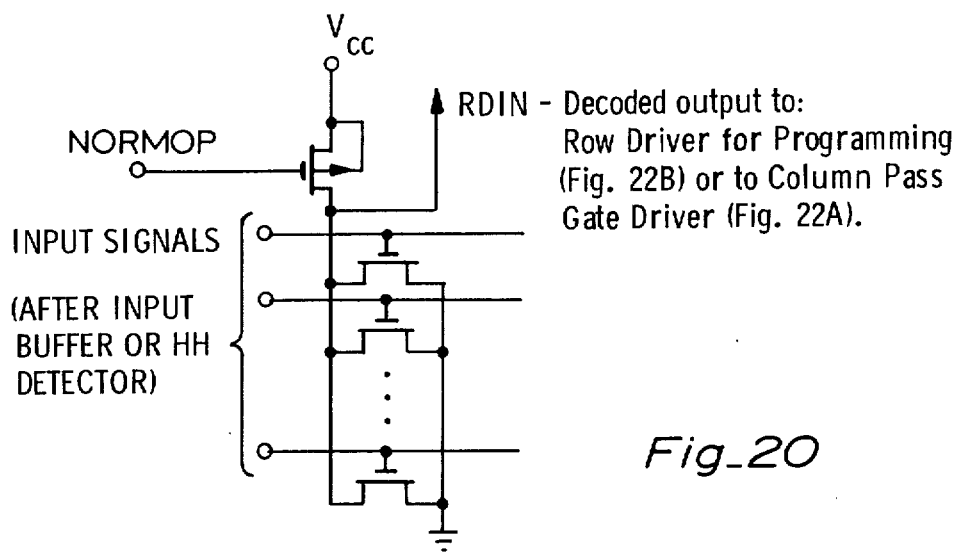
Fig_20
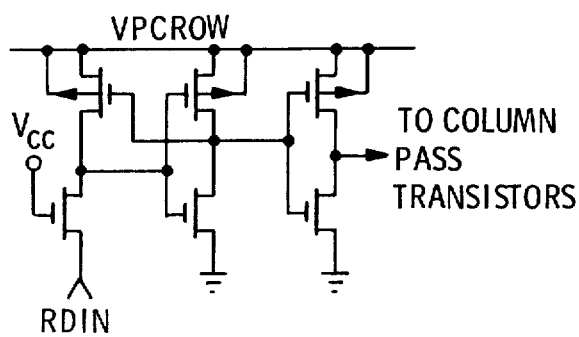
Fig_22A
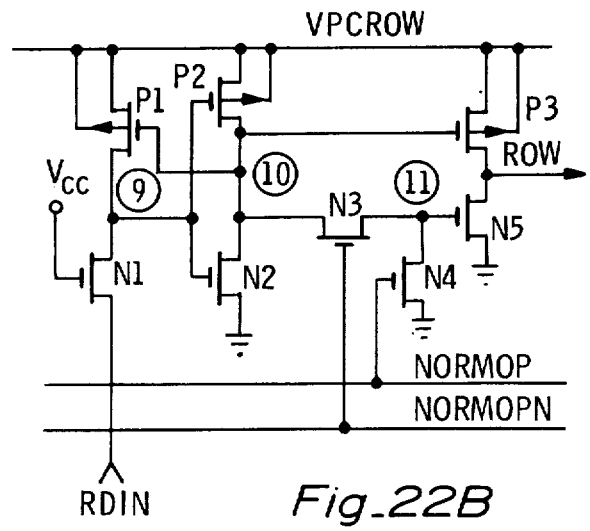
Fig_22B
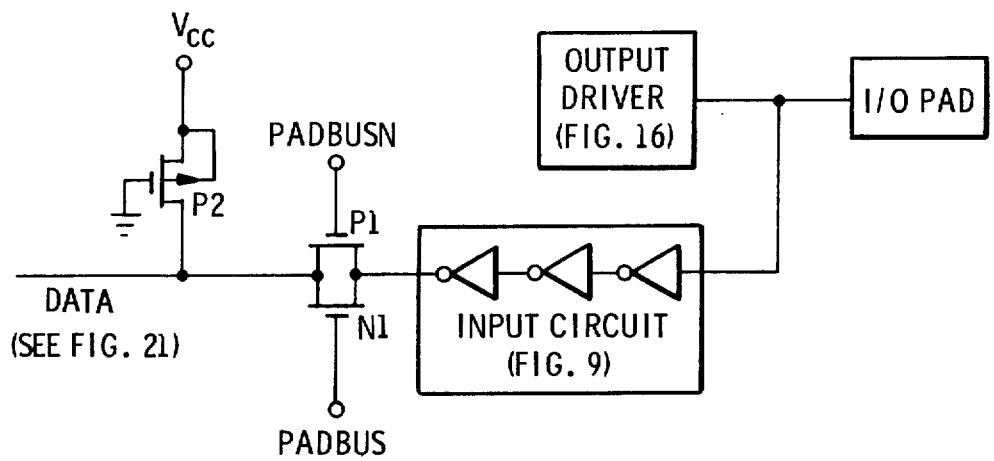
Fig_23

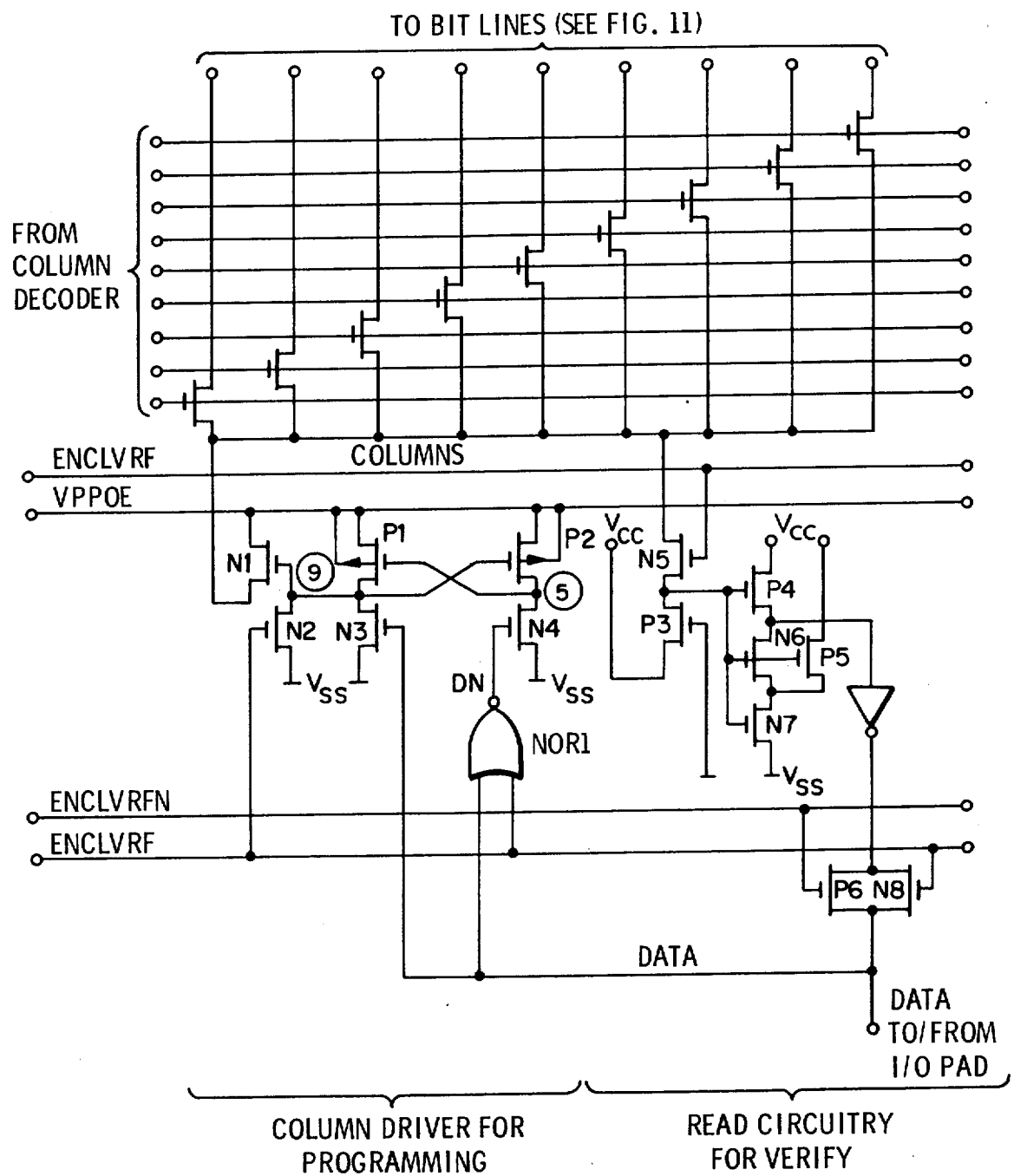
Fig_21

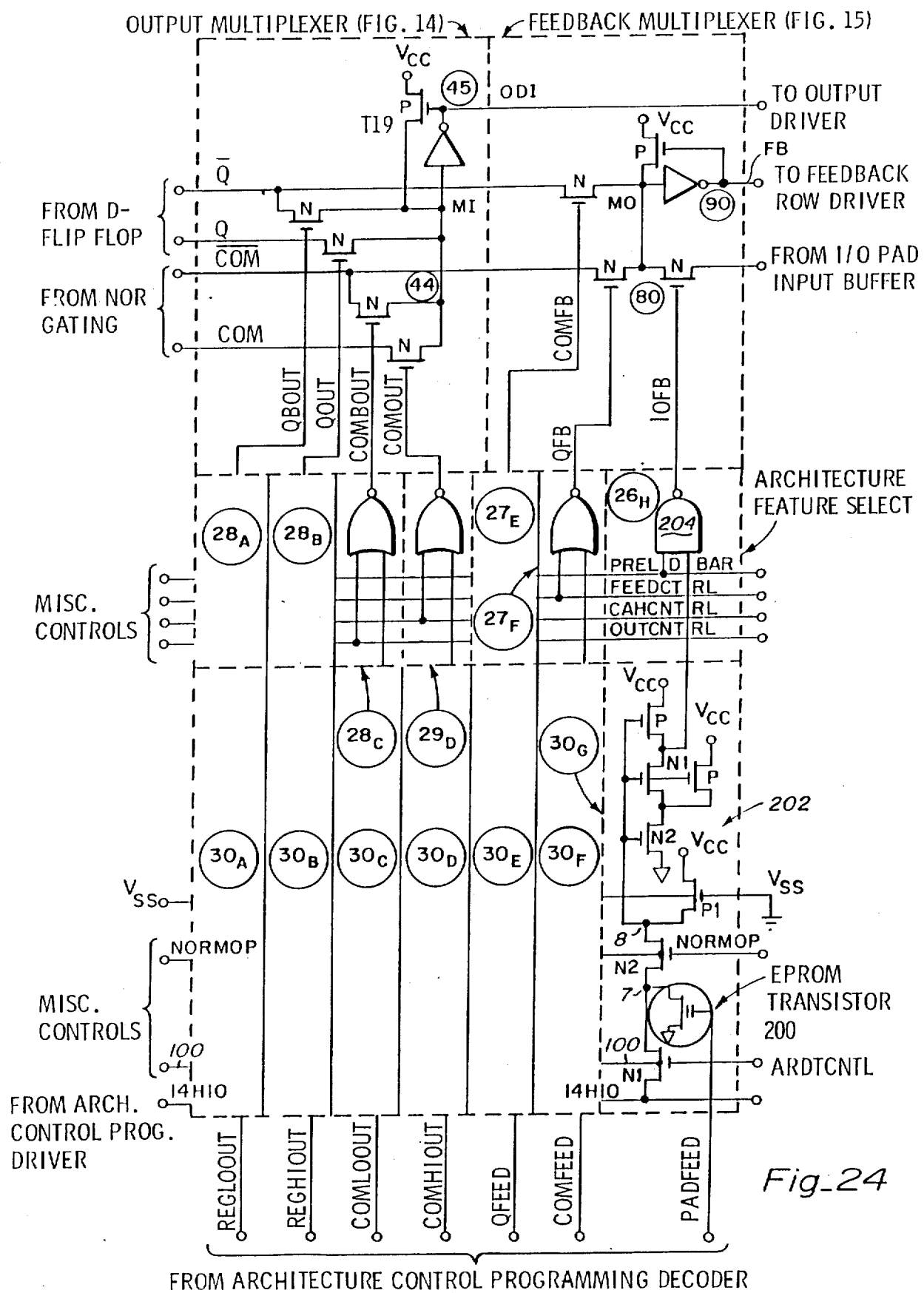
Fig_24

PROGRAMMABLE LOGIC ARRAY DEVICE USING EPROM TECHNOLOGY

BACKGROUND OF THE INVENTION

1. Field of the Invention

The present invention relates generally to programmable logic array devices and more particularly to an erasable, electrically programmable logic device made using CMOS EPROM Floating Gate technology.

2. Discussion of the Technology and Prior Art

The integrated circuit technology used in the fabrication of the present invention is CMOS Floating Gate (CMOS EPROM). Floating gate technology allows "programming" of certain transistors such that when normal operating voltages are applied (0 to 5 volts) the "programmed" transistor acts like an open circuit. In their unprogrammed state, these same transistors will conduct when 5 volts is applied to the gate terminal and will appear as an open circuit when 0 volts is applied to the gate terminal.

In the past, the normal application of the technology was to manufacture electrically programmable read only memories (EPROM). The programmable element in EPROM technology is a two layer polysilicon MOS transistor. By changing the circuits which access the array of programmable elements, programmable logic arrays (PLA) can be realized. Prior art U.S. patents include U.S. Pat. Nos.: Kahng, 3,500,142, Frohman-Bentchkowsky, 3,660,819; Frohman-Bentchkowsky, 3,728,695; Frohman-Bentchkowsky, 3,744,036; Frohman-Bentchkowsky, 3,755,721; Frohman-Bentchkowsky, 3,825,946; Simko et al, 3,984,822; and Lohstroh et al, 4,019,197.

Programmable logic arrays and similar circuit elements such as programmable array logic (PAL) have been in existence for many years. See for example, the U.S. Patents to: Crawford et al, U.S. Pat. No. 3,541,543; Spenser, Jr., U.S. Pat. No. 3,566,153; Proebsting, U.S. Pat. No. 3,702,985; Greer, U.S. Pat. No. 3,816,725; Greer, U.S. Pat. No. 3,818,452; Greer, U.S. Pat. No. 3,849,638. The first realizations were mask programmed. An example is a P channel MOS device manufactured by Texas Instruments during 1968-1970.

More recently, the techology of choice has been fuse programmable bipolar technology made by manufacturers such as Signetics, Monolithic Memories, Inc., Advanced Micro Devices, Harris Semiconductor and others.

The complexity of PLAs and PALs is given in terms of:

(a) The number of Inputs;
(b) The number of Product Terms in the AND array;
(c) The number of Sum Terms in the OR array;
(d) The number of Storage Elements (FLip Flops);
(e) The number of Feedback lines from the output of the OR array (or the Flip Flops) to the AND array; and
(f) The number of Outputs.

SUMMARY OF THE PRESENT INVENTION

The present invention relates to an electrically programmable integrated circuit with a logic complexity of approximately 300 (2-input) NAND gates. The preferred embodiment is designated The Altera EP300 and can generally be classed as a programmable logic array (PLA) with substantial additional circuitry such that many combinations of inputs, outputs and feedback can be accommodated.

The EP300 has the following characteristics:

(a) 10 Inputs (from off chip) to the AND array;
(b) 74 Product Terms (P-Terms);
(c) 8 Sum Terms (Fixed OR Structure with 8 P-Terms each);
(d) 8 D type Flip Flops;
(e) 8 Feedback lines; and
(f) 8 Outputs.

In addition to the above there are several other features of the EP300. These are listed below:

(a) One of the inputs (Pin #1) to the AND array also serves as the CLOCK to the D Flip Flops;
(b) The P-Terms are grouped as follows:
  (1) 8 each to 8 fixed OR/NOR gates (64 P-Terms);
  (2) 1 each to the Output Enable (OE) of each of the eight corresponding output drivers (8 P-Terms);
  (3) 1 P-Term for a asynchromous Reset to the D-Flip Flops;
  (4) 1 P-Term for a synchronous set to the D-Flip Flop;
(c) Each of the Sum Terms from the OR/NOR gate can be either "active high" or "active low";
(d) The I/O pins can output either combinatorial data (active high or active low) or registered data from the D flip flops (active high or active low);
(e) Feedback can be from one of the following three data sources; the I/O pins, the output of the register, the output of the OR gate;
(f) Selection of output data and feedback data is made by programming EPROM transistors in the Architectural Feature Select Section;
(g) EPROM transistors are used for all programmable elements. Thus, the device is electrically programmable and UV erasable.

The EP300 is intended to be used as a replacement part for standard family logic components such as the 74LSxx series and the more recent 74HC and 74HCT (CMOS) series. As a logic replacement device, a single EP300 will typically replace from 4 to 10 standard family logic components. The reasons for making such substitutions are:

(a) Greater logic density (more logic in less board area); and
(b) Lower system power The ultimate objective of the present invention is to produce a more powerful system for lower overall systems cost.

Typical applications for the EP300 are for random logic replacements such as decoders, comparators and multiplexers and for state machines. Logic replacement applications use the combinatorial features of the EP300 while the state machines use the registered feedback features.

These and other features and advantage of the present invention will become apparent to those skilled in the art after having read the following detailed description of the preferred embodiment shown in the several figures of the drawing.

IN THE DRAWING

FIG. 1 is a diagram schematically representing a floating gate field effect transistor;

FIG. 2 is a diagram representationally showing in cross-section a two layer polysilicon field effect transistor;

FIG. 3 is a diagram pictorially comparing the schematic diagrams, logic symbols and truth tables of an MOS N-channel switching device and an MOS EPROM switching device;

FIG. 4 is a diagram illustrating the circuit diagram, logic symbol and truth table of a NOR Gate device made using EPROM switching elements;

FIG. 5 is a schematic diagram showing an implementation of a sum-of-products generator using an array of EPROM NOR gates;

FIG. 6 is a logic symbol representation of an exclusive-or gate;

FIG. 6a is a schematic diagram illustrating an $E^2$ PROM cell;

FIG. 7 is a diagram showing generally the major functional components of the EP300 electrically programmable logic array;

FIG. 8A is a block diagram showing the functional components utilized (for a typical data path) when the EP300 is operated in the Read Mode;

FIG. 9 is a diagram schematically illustrating the Input Circuit of FIGS. 8A and 8B;

FIG. 10 is a diagram schematically illustrating the Read Row Driver of FIGS. 8A and 8B;

FIG. 11 is a diagram schematically illustrating the AND Array of FIGS. 8A and 8B;

FIG. 12 is a diagram schematically illustrating the OR/NOR Gates and Sense Amplifier of FIGS. 8A and 8B;

FIG. 13 is a diagram schematically illustrating the D Flip-Flop of FIGS. 8A and 8B;

FIG. 14 is a diagram schematically illustrating the Output Multiplexer portion of the Architecture Control Circuit of FIG. 8A and the OMUX circuit of FIG. 8B;

FIG. 15 is a diagram schematically illustrating the Feedback Multiplexer portion of the Architecture Control Circuit of FIG. 8A and the FMUX circuit of FIG. 8B;

FIG. 16 is a diagram schematically illustrating the I/O Driver of FIG. 8;

FIG. 17 is a block diagram showing the functional components utilized when the EP300 is operated in the Program Mode and Verify Mode;

FIG. 18 is a diagram schematically illustrating the HH Detect portion of the Input Circuit and Misc. Controls for Programming circuit of FIG. 17;

FIG. 19 is a diagram schematically illustrating the Three State Detector Portion of the Input Circuit and Misc. Controls for Programming of FIG. 17 and its truth table;

FIG. 20 is a diagram schematically illustrating the ROW and Column NOR Decoder of FIG. 17;

FIG. 21 is a diagram schematically illustrating the Column Driver, Read Circuitry and Column Pass Transistors of FIG. 17;

FIG. 22A is a diagram schematically illustrating the Column Pass Gate Driver portion of the Column Select Decoder for Programming of FIG. 17;

FIG. 22B is a diagram schematically illustrating the Row Driver of FIG. 17;

FIG. 23 is a diagram schematically illustrating the Data I/O circuitry of FIG. 17;

FIG. 24 is a diagram schematically illustrating the Architecture Control Circuit of FIG. 17.

DESCRIPTION OF THE INVENTION

Technology Discussion

Figure 8B:
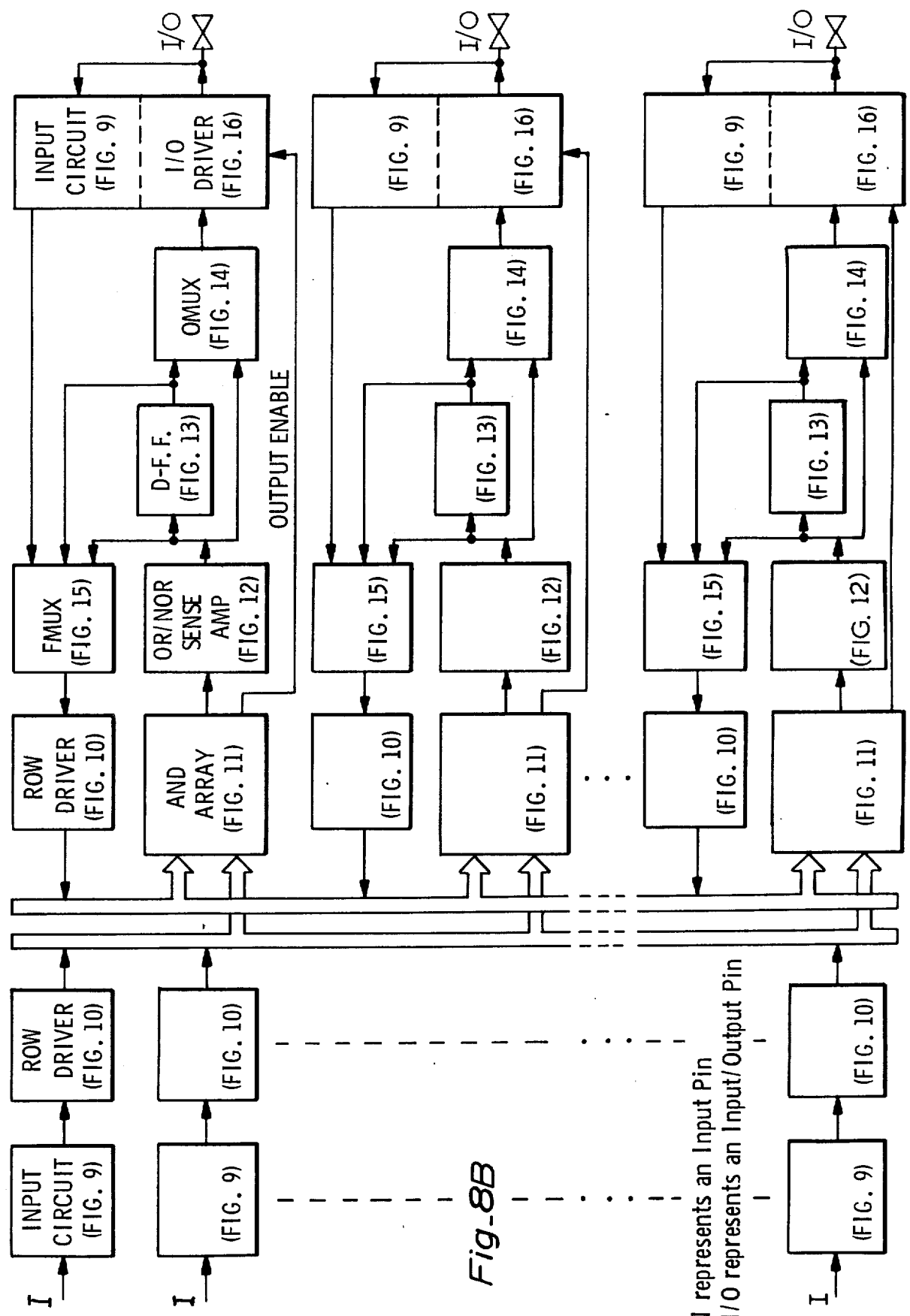
FIG. 8B is a generalized block diagram of the EP300 illustrating the major functional components and their interconnections when operated in the Read Mode.

In order to understand the EP300, it is necessary to understand MOS floating gate technology. The diagram shown in FIGS. 1 and 2 illustrate a 2 layer polysilicon transistor. An N-channel transistor is representationally shown but the basic mechanism applies to a P-channel transistor as well.

If it is assumed that the floating gate in the structure shown above is initially unprogrammed, then the transistor works as follows. Whenever a positive voltage greater than a certain threshold voltage (VT) is applied to the control gate, a channel is induced under the gate region which allows current to flow between the drain region and the source region. In a typical N channel floating gate device, VT is approximately 1.5 volts. The signals which are applied to the control gate are typically between 0 volts and 5 volts.

The effective threshold of the transistor can be changed by causing charges to be trapped on the floating gate. Electrons are caused to flow to the floating gate when high voltage (typically 21 volts) is applied to the control gate and the drain. When the high voltage is removed, charges remain trapped on the floating gate and cause the effective threshold to be increased to a value greater than the voltage which would be applied to the control gate during Normal Operation. The application of the high voltages and the subsequent charge trapping on the floating gate is called programming.

After the transistor shown above has been programmed, if a 5 volt signal is applied to the control gate, no channel will be created between the source and drain and no current will flow therebetween. This two layer transistor can be thought of as a programmable switch. In the unprogrammed state, the switch opens and closes in response to the application of 0 volts or 5 volts to the control gate. In the programmed state, the switch is always open regardless of whether 0 or 5 volts is applied to the control gate. Under normal environmental conditions, charges will stay trapped on the floating gate for very long periods of time (greater than 10 years). The typical application from this type of structure has heretofore been in the making of EPROMs (electrically programmable read-only-memories).

In the present invention, the EPROM transistor has been applied in a new way making the resultant structure suitable for implementing digital logic. The general structures will be described next.

Logic Structures Using EPROM Transistors

In the diagrams shown in FIG. 3, an inverter is shown in part (a) using a standard N-channel transistor 10 as the switching device and, in part (b) a floating gate transistor 12 is shown as the switching element. Below each schematic diagram, a logic gate representation and the corresponding truth table is shown. The truth table for the EPROM inverter in the unprogrammed state, gives the same result as the normal N-channel inverter. However, when the floating gate is programmed, the output is always pulled high, independent of the input. Thus, logic functions can be programmed out of a circuit by programming the floating gate.

In part (a) of FIG. 4 a NOR gate using EPROM elements 14, 16, . . . 18 is illustrated. In this device, the output is only a function of the inputs corresponding to floating gates left unprogrammed. In part (b), the corresponding logic diagram is shown, and in part (c) the truth table for the circuit is set forth.

This circuit is a one dimensional array of EPROM elements which forms a NOR gate, the elements of which are selectively programmable. By extending this concept to a two dimensional array and then collecting the programmable NOR outputs in another set of NOR gates, electrically programmable logic arrays such as illustrated in FIG. 5 can be formed.

There are three major component parts of the circuit shown in FIG. 5: the Array Input circuits 20, the programmable NOR (AND) array 22, and the NOR Gating circuits 24.

The Array Input section consists of a set of subcircuits each including a conductive path 26 formed between an input node 25 and a first output mode 27, and a second path including an inverter 28 coupled between node 25 and a second output node 29. Each input to circuit 20 and its complement thus becomes inputs to the Programmable NOR Array 22.

As illustrated in FIG. 5, the programmable NOR array 22 is comprised of a plurality of gates 30, 31 arranged in a two dimensional array of columns 32–38 and rows 40–45. The control gate electrodes of alternating rows 40, 42, . . . 44 of gates 30 are connected to an output node 27, while the corresponding gate electrodes of alternating rows 41, 43, . . . 45 of complement gates 31 are connected to an inverted output node 29 of the input circuit array 20. The drain regions of the transistors 30, 31 in each column of columns 32–38 are commonly coupled to a corresponding array output node of the nodes 50, 52, 54, . . . 56, and the source regions of the transistors of each column are coupled to circuit ground.

The outputs of the EPROM NOR gates feed into the gate electrodes of another NOR gate array 24 consisting of gates 58–64 which are connected in parallel and produce the desired output at an output node 66. This circuit can generate any logical function of the input variables by generating a so-called "sum-of-products" expression.

The example shown in FIG. 6 will be used to illustrate the case of a 3-input exclusive-or gate. The function of this circuit can be written in logic equation form as:

$$OUT = A \oplus B \oplus C$$

where $\oplus$ is the exclusive-OR operator. This expression can be expanded to the following sum of products $$OUT = A \cdot B \cdot C + \overline{AB}C + \overline{A}B\overline{C} + A\overline{BC}$$

The groupings of variables on the right side of the equation are called "product terms" (e.g. A·B·C), and the product terms are "SUMed" together to produce the expression for OUT. By designating certain of the inputs (I1, I2, . . . ) of FIG. 5 as the variables A, B, C of FIG. 6 and by appropriately programming the array 22 of FIG. 5, the desired exclusive-or function of FIG. 6 can be realized. All logic equations can be expressed in this sum-of-products form. (See for example *Logic Design Of Digital Systems* by Dietmeyer).

The schematic diagram shown in FIG. 5 is an implementation of a sum-of-products generator in which the product generator is an array of EPROM NOR gates (columns) 32–38 whose outputs feed another NOR gate 24. In the illustrated example, the "PRODUCT" array 22 is programmable and the "SUM" array 24 is a fixed NOR gate. The fixed NOR gate 24 could alternatively be replaced by an EPROM NOR gate or an EPROM NOR array such that both the SUM array and the PRODUCT array are programmable. This would then be a realization of an EPROM Programmable Logic Array (EPLA) in accordance with the present invention.

Comparison to Other Competing Technologies

Although other programmable elements such as fuse-link and EEPROM devices exist which are suitable for implementing Programmable Arrays, they each have certain disadvantages. In general, the fuse-link elements are less desirable than EDPROM elements because:

(1) They take up more silicon area;
(2) They require high current to "blow" the fuse; and
(3) Once programmed, the fuse is physically blown and can not be repaired. These devices are therefor one time programmable.

The EEPROM element has two drawbacks:

(1) It requires more silicon area than does EPROM; and
(2) The technology is less mature.

However it does have the advantage of being electrically eraseable and reprogrammable, thus allowing for logic functions to be changed in the system in which it is being used. This means that a logic system could modify itself based upon some set of conditions. This also means that real time alterable logic system or "adaptive logic systems" are possible. Furthermore, by replacing EPROM elements with EEPROM cells such as shown in FIG. 6a, an $E^2$ logic array can be realized. In this diagram, N-channel transistors are assumed, but P-channel transistors could also be used with appropriate changes in signal voltages.

General Discussion of the EP300 Logic Diagram

FIG. 7 is an overall diagram showing the major functional components of the EP300 electrically programmable logic array.

The various circuit components will be described within the context of the several Modes of Operation of the EP300. These modes are: Read Mode (also referred to as normal operation), Program Mode, Verify mode, Preload Mode, Test Mode 1, and Test Mode 2.

Read Mode (Normal Operation)

As illustrated in the simplified block diagram of FIG. 8A, the Read Mode circuits consist of the Input Circuit 80, the Read Row Driver 82, the AND Array 84, the OR/NOR Gates and sense amplifier 86, the D Flip-Flop 88, the Architecture Control 90, and the I/O Driver 92.

FIG. 8B is a further illustration of the EP300 showing the major functional blocks and their interconnection when operating in the Read Mode. Each input (designated as I) drives an input Circuit (FIG. 9) which drives a Row Driver (FIG. 10) which drives all AND Arrays (FIG. 11). ((In the EP300, groups of Product Terms are ORed together by individual OR/NOR Sense Amp circuits (FIG. 12). We will, in this document, interchangeably refer to each collection of Product Terms as an AND Array and also refer to all the Product Terms in the EP300 as the AND Array.)) As illustrated in FIG. 8B, all inputs go to all of the AND Arrays. The AND Array drives the OR/NOR Sense Amp (FIG. 12). The output of the OR/NOR Sense Amp is a Sumof-Products of all signals which feed the AND Array. Each Sum term drives a D Flip-Flop (FIG. 13), a OMUX (FIG. 14) and an FMUX (FIG. 15). The output of the D Flip-Flop drives the OMUX and the FMUX. The OMUX drives the Output Driver (FIG. 16) which in turn drives the I/O pin. Each Output Driver is enabled by a Product Term from the AND Array. The FMUX can receive inputs from the OR/NOR Sense Amp or the D Flip-Flop or the Input Circuit connected to the Associated I/O pin. The FMUX drives a ROW driver circuit which in turn drives the AND Array.

Input Circuit—The input circuit 80 accepts a standard TTL level input signal, level shifts the signal and provides an output to the Read Row Driver 82. A simplified schematic of the input circuit 80 is shown in FIG. 9. As shown therein, an input signal comes in through a bonding pad 94 and passes through an input protection circuit consisting of resistors R1 and R2, and a so called "gate-aided- breakdown" N-channel transistor T1 which protects the gate of transistors T2 and T3 from static discharge. Transistors T2 and T3, and resistor R3 and capacitor C1 form a level shifter. TTL input levels are defined as VIL=0.8 volts and VIH=2.0 volts. T2 is a P-channel transistor and T3 is an N-channel transistors. The sizes of these transistors are chosen such that when the input is at VIL the voltage at Node 1 will be VCC (+5 volts) and when the input is VIH, Node 1 will be at less than the threshold voltage of T5. When the input is at 2.0 volts (minimum VIH), both T2 and T3 are conducting. It is desireable to minimize the current flow from VCC thru T2 and T3 during this condition. R3 helps by causing a voltage drop between VCC and the source node of T2. This helps to turn T2 off because the source to gate voltage is reduced by the amount of the IR drop. The addition of resistor R3 increases the speed through the level shifter, reduces power dissipation and allows better sensing of TTL levels. Capacitor C1 is added to speed up the positive transition of Node 1 by helping to hold the source voltage of T2 constant when the input is switched from VIH to VIL. Transistors T4 and T5 form a normal CMOS inverter pair. However T5 is chosen to be larger than T4 to move the switching point lower. Thus as soon as Node 1 gets slightly higher than the turn on voltage VT of T5, Node 2 will go low. Inverter pair T6 and T7 act as a buffer for Node 2 and are capable of driving the Read Row Driver circuit shown in FIG. 10.

Read Row Driver—Referring to FIG. 10, the signal from the Input Circuit drives logic gates G11 and G12 of the Read Row Driver. G11 is a standard CMOS inverter and G12 is a standard CMOS two input NOR gate. Control signals NORMOP and NORMOPN disable the Read Row Driver circuit during Program Mode. The Read Row Driver circuit is active when NORMOP is a logic 1 and NORMOPN is a logic 0. Also VPC Well is at VCC. A logic 1 level from the Input Circuit 80 causes the outputs of G11 and G12 to go low turning T15 OFF and turning T14 ON pulling the output TO AND ARRAY to VCC and turning T13 off. A logic 0 from the Input Circuit 80 causes the output of G11 and G12 to go high turning T15 ON pulling the output toward VSS. At the same time, G11 pulls the gate of T14 high turning it OFF. As the output goes low, T13 is turned ON helping to turn T14 OFF. For each input, both "true" and "complement" signals must drive the AND array 84. Thus, there are two Read Row Drivers per Input. The second driver (not shown) has an extra inverter disposed between the Input Circuit and the Read Row Driver.

AND Matrix—The AND matrix is an array of EPROM NOR gates as discussed above. A single EPROM NOR gate is shown in FIG. 11 to illustrate the actual Pull-up circuit used.

The gate of the N-channel pull-up circuit 96 is driven by the signal ENBLTOSA (Enable Bit Line To Sense Amp). This signal can be turned off during program mode to isolate the bit lines BL1, BL2, . . . BLn from VCC. Each bit line BLn is also connected through a column select transistor 98 to the column driver. These column select transistors are turned OFF during Normal Operation. The gates of the EPROM transistors 30 and 31 are driven by signals RRD and $\overline{RRD}$ which are representative of the true and complement signals from a Read Row Driver. In the EP300 there are 18 signal pairs; 10 from input signals and eight from feedback signals. Thus, each bit line BLn is a 36 input EPROM NOR gate. The bit line can also be thought of as a 36 input AND gate $$(\overline{A} + \overline{B} + \overline{C} \ldots = A B C \ldots)$$

The collection of bit lines will be referred to as the programmable AND matrix. In the EP300, bit lines are collected together in groups of 9. Eight of the nine bit lines go into the OR/NOR gating circuit 86 which will be discussed next, while the 9th bit line goes to control the tri-state of the associated output driver.

OR/NOR Gate, Sense Amplifier—As shown in FIG. 12, a grouping of eight bit lines are ORed together in the NOR Sense Amplifier. Transistors T1 through T13 are a sense amp-NOR gate. T1 through T8 receive their inputs from their respective bit lines. T9 acts as a pullup. The "trip point" of the NOR gate is set by the threshold voltage of T1 through T8 plus the offset voltage created by current flowing through T12 and T13. This current flow is adjusted by T10 and T11. When the Voltage of any of the bit lines exceeds the Variable Reference voltage, the output (OUT) will go low. Inverters G1 and G2 amplify the signal producing Sense Amp Output which goes to the D flip-flop 88 and the variable reference circuitry 87. The Sense Amp Output is fed back to the variable reference circuit through inverters G3 and G4. The feed back mechanism is such that if any bit line goes high, the Sense Amp Output will go low. After a slight delay caused by gates G3 and G4 and transistors T17 and T18, the output of G3 will also go low, causing the Variable Reference Signal to increase and in turn raise the trip point of the NOR gate Sense Amp. Thus, the trip point is adjusted according to the present state of the Product Term inputs. By adjusting the reference in this way allows the EP300 to sense a smaller signal swing and hence operate faster.

D Flip-Flop—As illustrated in FIG. 13, the Sense Amp Output from FIG. 12 is input to a D Flip-Flop 88 after passing through the 2 input NAND gate 100, the other input of which is $\overline{SET}$. The $\overline{SET}$ input comes from a single product term from the AND array 84. Whenever the $\overline{SET}$ line is a logic zero, the D input is forced to a logic 1 independent of the Sense Amp Output. The NAND gate 100 thus provides a synchronous SET to the D Flip-Flop where the SET is a function of any of the inputs to the AND array.

The Flip-Flop circuit is a conventional masterslave configuration using N and P channel pass transistors. As explained above, the Flip-Flop has a synchronous set and also has asynchronous reset. The $\overline{\text{RESET}}$ input is also a single term from the AND array. If both $\overline{\text{SET}}$ and $\overline{\text{RESET}}$ are asserted (low), the reset overrides set causing Q to go low and $\overline{Q}$ to go high. With neither $\overline{\text{SET}}$ nor $\overline{\text{RESET}}$ asserted, the Sense Amp Output is "captured" by the Flip-Flop 88 on the low to high transistion of CLK. The Q and $\overline{Q}$ outputs are then passed to the Architecture Control circuit.

Architecture Control—The Architecture Control circuit consists of two pass-gate multiplexers which are designated the Output Multiplexer (OMUX) and the Feedback Multiplexer (FMUX). As depicted in FIG. 14, the OMUX has four data inputs. These are Q and $\overline{Q}$ from the Flip-Flop 88, and the Sense Amp Output signal and its complements which are designated COM and $\overline{\text{COM}}$. (COM stands for combinatorial because it is a direct duplication of the combinatorial logic function produced by the AND array and the OR/NOR gate and Sense Amplifier circuit)

OMUX Circuit—The OMUX controls are QOUT, QBOUT, COMOUT and COMBOUT. The state of the OMUX control signals are determined by a set of EPROM bits which will be described below as part of the Architecture Feature Select Circuitry in FIG. 24. Because pass gates are used, only one OMUX control should ever be asserted (active high) or else a signal conflict at MI could exist. For example, if both QOUT and QBOUT are asserted, the Q and $\overline{Q}$ data inputs will be in conflict and the logic level at node MI will be indeterminate.

The OMUX allows the EP300 outputs to be configured as "registered" or "combinatorial" and be either active high or active low. The data which is passed to node MI is amplified by the inverter whose output (labeled ODI) becomes the input to the Output Driver. The ODI signal also feeds back to drive the gate of a P-channel transistor T19 whose source is tied to VCC and whose drain is tied to node MI. This transistor pulls mode MI to a full VCC level. Without it, MI would be one VT voltage lower than the OMUX control signal (approximately 3.5 volts). This then helps to speed up the MI signal transition (to a logic one) and insure a good logic level at the inverter.

FMUX Circuit—The FMUX shown in FIG. 15 is of similar construction to the OMUX. It is a 3 input pass gate multiplexer. The data inputs are Q (from the Q output of the D Flip-Flop 88), COM (combinatorial data from the AND-OR arrays), and IOI (from the IO pad input). The corresponding controls are QFB, COMFB and IOFB. As with the OMUX, the states of these controls are determined by EPROM bits in the Architecture Feature Select block. There is an OMUX and an FMUX associated with each of the AND-OR blocks of the EP300.

I/O Driver—The signal ODI from the Output Multiplexer becomes the input to the Output Driver as shown in FIG. 16. ODN is the (active low) output disable signal which comes from a single product term from the AND Array. The output circuit works as follows: The Output Driver is active whenever ODN is high. Both the N and the P channel transistors (N2, P2) between node 7 and node 8 are conducting as are the N and P channel transistors (N1, P1,) between ODI and node 6. Data from the OMUX (ODI) drives transistors N3 and P3 which in turn drive the output driver transistors N5 and P4. When ODI is a logic 1, the I/O Pad is driven to VCC through P4 and when ODI is a logic 0, the I/O pad is driven to VSS through N5. If signal ODN is driven low, transistors N1 and P1, and N2 and P2 are turned OFF. Node 8 is driven to VSS through N4, and node 6 is driven to VSS through N6. Node 7 is driven to VCC through P3. Under these conditions, both P4 and N5 are turned OFF. This is the tri-state condition for the output driver.

The I/O pins on the EP300 may be used as either inputs or outputs. When used as inputs, the Output Driver is disabled by means of the ODN signal described above. An input signal applied to the I/O pin goes to an Input Circuit as was shown in FIG. 9. The signal IOI in FIG. 16, is the amplified and level shifted verson of the input signal applied to the I/O PAD and is passed to the FMUX.

PROGRAM MODE

Prior to using the EP300 in an application, it is necessary to program the EPROM Transistors in the AND array 84 and in the Architecture Feature Select block 90. FIG. 17 is a block diagram showing the functional components utilized when the EP300 is operated in the Program Mode and Verify Mode. Programming of an EPROM transistor is accomplished by applying high voltage to the gate and the drain. The high electric field from drain to source creates so called "hot electrons". These hot electrons are attracted to the floating gate because of the high gate voltage. For 3 micron terminology, a gate voltage of 21 volts and a drain voltage of approximately 16 volts will program the floating gate. Electrons with enough energy to jump from the drain to the floating gate remain trapped on the floating gate after the high voltages are removed. The presence of electrons on the floating gate cause the threshold voltage, as seen from the control gate, to be substantially increased such at that under normal gate voltages (+5 V) it never will turn ON. Thus, an unprogrammed EPROM transistor will conduct with 5 volts on the gate and will not conduct with 0 volts on the gate, while a programmed EPROM transistor will not conduct in either state.

In order to program a single transistor in the AND array, a row and column selection must be made and appropriate high voltages applied. Some of the read circuitry described above must also be disabled so as to not cause damage. The circuits to be disabled are the Read Row Driver 82 and the pull-ups to the AND ARRAY 84. The Read Row Driver is disabled by causing NORMOP to go low. The AND ARRAY pull-ups are disabled by causing ENBLTOSA to go low. The Output Drivers must also be tri stated because the I/O pins will be used as "program data" inputs. After a particular row and column are selected, the program data determines if the selected location is to be programmed or not.

Since all pins are used during normal operation, they must be redefined for programming. The program mode is entered whenever pin 11 is raised to a VHH level. VHH is a voltage greater than 10 volts and may be as high as 21 volts which is the VPP programming voltage. Several pins have VHH detection circuits which invoke various program, verify, and test modes. The following table lists the conditions required to enter various modes.

| MODE | PIN 1 | PIN 2 | PIN 3 | PIN 4 | PIN 9 | PIN 11 | PIN 5-8 | PIN 12-19 |
|---|---|---|---|---|---|---|---|---|
| NORMAL OPERATION | NORMAL INPUT LEVELS (Vil-Vih) AS DEFINED BY THE APPLICATION | | | | | | | NORMAL I/O |
| PROGRAM | PRO-GRAM PULSE | ADDRESS INPUTS (Vil, Vih, Vhh) | | | | VPP | ADDRESS INPUTS (Vil, Vih) | DATA INPUT |
| VERIFY | Vhh | ADDRESS INPUTS (Vil, Vih, Vhh) | | | | X | ADDRESS INPUTS (Vil, Vih) | DATA OUT-PUT |
| PRELOAD | CLOCK (Vil, Vih) | NORMAL INPUTS (Vil, Vih) | | | Vhh | | NORMAL INPUTS (Vil, Vih) | DATA INPUT |
| TEST MODE 1 | Vil | Vhh | Vil | X | X | Vpp | X | DATA OUT- |
| TEST MODE 2 | Vil | Vhh | Vih | X | X | Vpp | Row Add- | DATA OUT- |

An EP300 is programmed in a manner similar to an EPROM memory. Taking Pin 11 to a VHH level causes the function of the pins to be redefined such that pins 2 through 9 become addresses which select a matrix row and column, and pins 12 through 19 become data inputs. The state of the data input lines determine whether a location will be programmed or left in its erased state. Eight bits can be programmed at a time.

Eight pins (2 thru 9) are defined as addresses. If each has only two values (VIL, VIH) then only 256 locations can be selected. Actually, 324 array locations, 7 architectural locations and 1 security bit location must be accessible. In order to extend the address capability of the eight input lines, two pins (4 and 9) have three allowed values (VIL, VIH, VHH). This permits the addressing of all locations.

HH Detect Circuitry

The HH Detect Circuit is shown in FIG. 18. The allowable input values are VIL (VSS≦VIL≦0.8), VIH (2.0≦VIH≦VCC), and VHH (10≦VHH≦VPP). For any input value between VSS and VCC+VIP, the P-channel transistor P1 is not conducting. Since the N-channel transistor is always conducting, the voltage at HHDET is pulled to VSS through N1. (Inverters HHN and HH are simply buffers for node HHDET). Thus, the signal at HH is zero whenever the input signal is a normal logic level (VIL or VIH).

If the input signal is raised above VCC+VTP, transistor P1 begins to conduct. Current flows from the input pad thru P1 and N1 to VSS causing a voltage drop across N1. The transistor sizes are adjusted such that when the input signal is greater than 10 volts, the mode HHDET is above the switching threshhold of the inverter HHN. Thus, with an input level greater than 10 volts, the output from the second inverter HH, is at a logic 1. The table below shows the situation.

| INPUT SIGNAL | HHDET | HHN | HH | |
|---|---|---|---|---|
| VSS = VIL = 0.8 | 0 | 1 | 0 | Normal input levels detected. |
| 2.0 = VIH = VCC | 0 | 1 | 0 | |
| 10.0 = VHH = VPP | 1 | 0 | 1 | HH input levels detected. |

As is illustrated in FIG. 19, input signals (applied to pins which have HH detectors) are connected to a normal Input Buffer (FIG. 9) and an HH detector circuit (FIG. 18). Signals from the Input Buffer can be logically gated with signals from the HH detector to create a third state. The three states are shown in the diagram of FIG. 19.

Row and Column Decoding—Internal Signals from input buffers or HH detectors are passed onto either a row decoder or a column decoder. These decoders are NOR decoders consisting of N-channel pull-down transistors with P-channel pull-ups to VCC. Except for the Architectural Decoder, these P-channel pull-ups are gated by a signal called NORMOP. By doing this, the NOR decoders only dissipate power during programming. A typical NOR Decoder is shown in FIG. 20.

Column Driver—Outputs from the Column Decoder drive the Column Pass Gate Driver (FIG. 22A) which, in turn drives the gates of the Column Pass Transistors 98 shown in FIG. 11. Referring to FIG. 11, one can see that one side of the Column Pass transistor is tied to a bit line while the other side is joined in common with other Column Pass Transistors. The common node 99 is driven by the Column Driver for programming. FIG. 21 shows a group of Column Pass Transistors (typically 9) being driven by one Column Driver.

The Column Driver works as follows. When the Programming Mode is invoked, VPPOE (which comes directly from Pin 11) is at a VPP level (21 volts). ENCLVRF is at a logic 0 and ENCLVRFN is at a logic 1. NOR1 then reacts only to DATA. Assume DATA is at a logic 1, then DN is zero. This turns OFF transistor N4 and turns ON transistor N3 which pulls node 9 low which in turn pulls node 5 high. This causes transistor P1 to turn OFF and P2 to turn ON. With node 9 low, transistor N1 is OFF thus blocking any current flow from VPPOE to the COLUMNS. Thus with DATA at logic 1, the selected EPROM bit (as selected by the Column Pass Transistor and the ROW DRIVER) will stay in the erased state. Next, assume DATA is at a logic 0. Then DN will be 1 causing N4 to turn ON, pulling node 5 low. This in turn causes P1 to turn ON pulling node 9 high which causes N1 to turn ON and provides a current path fromm VPPOE through the Column Pass Transistor to the selected EPROM bit. Thus, with DATA at logic 0, the selected EPROM bit will be programmed.

In the VERIFY MODE, which will be discussed later, ENCLVRF is at a logic 1 thus overriding DATA by forcing DN and Node 9 to be low which turns transistor N1 OFF. This effectively disables the Column Driver during the VERIFY MODE.

Row Driver—The Row Driver is a tri-stateable driver whose inputs are zero to 5 volt levels from the ROW DECODER and whose outputs are zero to VPP. The ROW DRIVER outputs drive the gate terminals of the EPROM transistors in the AND ARRAY. A schematic diagram of the ROW RRIVER is shown in FIG. 22B.

The Row Driver works as follows: Assume the signal NORMOP is a logic 1 and NORMOPN is logic 0, which is the situation in the READ MODE described above. The signal RDIN from the ROW DECODER is at logic 0 because the decoder pull-up is OFF (see FIG. 19) VPCROW is a local power line which can be switched between VCC and VPP. During the READ MODE, VPCROW is equal to VCC. The signal RDIN is passed through transistor N1 pulling the gates of N2 and P2 low causing node 10 to go high and turning OFF P1 and P3. The pass transistor N3 is turned OFF by NORMOPN, isolating node 10 from node 11. Transistor N4 is turned ON by NORMOP causing node 11 to go low and turning OFF transistor N5. Thus both P3 and N5 are OFF and the output line ROW is left free to be driven by the READ ROW DRIVER described above.

Next, assume NORMOP is at logic 0 and NORMOPN is at logic 1. This is the case during programming. The Row Decoder (FIG. 20) is activated and RDIN can be either logic 0 (decoded) or logic 1 (not decoded). Transistor N3 is turned ON and N4 is turned OFF, thus, connecting node 10 to node 11. VPCROW is switched to the VPP level. Now, if RDIN is low, node 10 is pulled high turning P3 OFF and turning N5 ON, thus pulling ROW to Vss. If RDIN is at logic 1, N2 is turned ON pulling node 10 low. This turns P1 ON, thus pulling node 9 to VPP. Pass transistor N1 blocks the VPP level from the ROW DECODER. With node 9 at VPP, P2 is turned OFF, and N2 is turned ON pulling nodes 10 and 11 low. This turns P3 ON and N5 OFF and drives ROW to VPP. Since ROW drives the gates of the EPROM transistors, programming can now take place.

Row and Column decoding and driving is done simultaneously. A particular EPROM transistor is determined by the intersection of a row and a column.

Data Input For Programming—An EPROM transistor is selected at the intersection of the decoded row address and the decoded column. Whether the selected EPROM transistor is actually programmed, or left in its erased state, is determined by the DATA supplied to the Column Driver as explained above. The DATA line is driven by circuitry as shown in FIG. 23. When the PROGRAM MODE is invoked, the output driver is tri-stated. The signal PADBUS is at logic 1 and PADBUSN is at logic 0 causing the pass transistors (P1 and N1 in FIG. 23) to turn ON. The logical sense of DATA is inverted from that presented at the I/O Pad. From the previous discussion, this means that if a logic 0 is presented at the I/O pad, the selected EPROM transistor will remain in the erased state, while a logic 1 presented at the I/O Pad will cause the EPROM transistor to be programmed.

The purpose of transistor P2 in FIG. 23 is to insure that DATA will be forced to a logic 1 whenever the pass transistors driven by PADBUS and PADBUSN are turned OFF.

Architecture Feature Programming—The architecture of the EP300 is determined by which paths are selected in the Output and Feedback Multiplexers of FIGS. 14 and 15. These multiplexers are in turn controlled by the Architecture Control Circuits (there is one for each multiplexer control) shown in FIG. 24. The Architecture Control Circuit output consists of an EPROM transistor 200 whose state is "read" by a Schmidt trigger circuit 202. The output of the Schmidt trigger feeds a control gate 204 and the output of the control gate drives the particular multiplexer. There are seven control signals (4 output multiplexer controls and 3 feedback multiplexer controls) per output macro cell requiring 7 Architectural Control Circuits per macro cell. There are eight macro cells thus requiring 56 Architecture control Circuits in the EP300.

The EPROM bits for Architecture Control are programmed as follows. (Refer to FIG. 24). In the Program Mode, NORMOP is at logic 0 turning OFF transistor N2 thus isolating the EPROM bit from FMUX. EPROM transistor 200 is programmed by raising ARDTCNTL at the gate of N1 to VPP. Also, the gate of 200 (PAD-FEED) is raised to VPP by the Architectural Program Decoder (FIG. 20) and a VPP level shifting circuit similar to the Pass Gate Driver (FIG. 22A). At the same time, line 14H10 is raised to a VPP-VT level by a column driver circuit similar to that shown in FIG. 21.

Referring now again to FIG. 24, to verify that the EPROM bit has been programmed, PADFEED and ARDTCNTL are taken to Vcc levels. The Architecture Control Program Driver is then disabled and a sense amplifier is connected to 14H10. The sense amplifier senses the state of the EPROM bit and passes the information to the associated Output Driver.

During the READ Mode, the following conditions apply. ARDTCNTL is taken to Vss thus disconnecting node 7 from line 14H10. PADFEED and NORMOP are taken to Vcc. The state of the EPROM bit can then be determined as follows: first, assume that the EPROM transistor 200 has been programmed. Transistor P1 will then pull node 7 and node 8 to Vcc. This will cause transistors N1 and N2 to turn ON pulling node 12 to Vss. During READ, PRELDBAR is at a logic 1. Thus, with node 12 at logic 0, IOFB will be at logic 1 which selects the I/O Pad as the signal to be passed through FMUX to the Feedback Row Driver. If the EPROM transsitor had been in its erased state, nodes 7 and 8 would have been pulled high. This would force IOFB to a logic 0. Thus, in the Architecture Feature Select, a programmed EPROM bit selects a feature and an unprogrammed bit de-selects a feature. Initially, in the erased state, all features are de-selected.

Referring now again to FIG. 17 which is a block diagram of the EP300 for either the Program or the Verify Mode and also referring to the EP300 Mode Select Table for the conditions which select the Verify Mode, it will be seen that the Verify Mode provides a means of interrogating the AND matrix and the Architecture Feature Select Matrix to determine which EPROM transistors have been programmed. Verify Mode is invoked by taking pin 1 to Vhh. All other inputs are then directed through the INPUT CIRCUITS and approximate control circuits to the ROW DECODER, the COLUMN SELECT DECODER and the ARCHITECTURE CONTROL PROGRAM DECODER. Depending upon the state of the inputs, either eight locations in the AND ARRAY or one of the ARCHITECTURE FEATURES associated with each ARCHITECTURE CONTROL block will be directed through the I/O DRIVERS.

Verify is essentially the reverse process from Programming. The location to be interrogated during Verify is determined by the Input Signal exactly as it would be during Programming. The COLUMN DRIVERS and the ARCHITECTURE CONTROL PROGRAM DRIVERS are disabled and corresponding SENSE AMPLIFIERS are enabled. The data which is read by the SENSE AMPLIFIERS is directed to the output pins through the I/O DRIVERS.

TESTMODES

There are 2 special modes on the EP300. The following Table shows the control voltages necessary to enter the modes. Pin 2 at the HH level signifies the special modes. Pin 1 must be at Vil for the modes to operate properly.

| PIN 1 | PIN 2 | PIN 3 | TESTMODE |
|---|---|---|---|
| Vil | HH | Vil | 1 |
| Vil | HH | Vih | 2 |

(1) Testmode 1

Testmode 1 is a reliability test to ensure the integrity of the EPROM elements. During this MODE, all EPROM elements except the VERIFY PROTECT EPROM bit will be stressed. Charge gain/charge loss, and oxide integrity problems may be detected when the mode is exercised in relation to TESTMODE 2 and/or VERIFY mode.

In TESTMODE 1, the gates of all EPROM elements will correspond to the voltage supplied on the VPP/OE pin (pin 11). One can stress all the gates from approximately 4 to 21 volts depending on the reliability test requirements. The supplies to drains of the matrix (2664 bits) and those in the architecture control section (56 bits) are all turned OFF. The voltages on the output pads will be either 1 or 0 depending on the programmed states of the matrix EPROM cells and the voltage supplied on pin 11.

(2) Testmode 2

TESTMODE 2 is used to detect the Vts of programmed bits in the matrix. In the TESTMODE 2 circuit implementation of the EP300, only the highest VT of the 8 bits in a macrocell group may be detected. VTs of OE, SET and RESET bits cannot be read out using TESTMODE 2.

During TESTMODE 2, all the column pass transistors are turned OFF and an individual row of the matrix is selected by the inputs through the row decoder. The row line voltage is the voltage on the VPP/OE pin (pin 11). One of the multiplexers is turned ON to allow the data from the matrix sense amp to be read out.

Assuming all EPROM bits on the row are programmed, and if the gate voltage on the row is less than the programmed VT on the row of 8 cells, the output on the pad will be a logic 1. When the voltage on pin 11 is raised above the highest VT on that row, the output will trip to a logic 0.

The VT of an individual bit can be read out if only one bit per row is programmed. However, to test the VTs of all bits, the programming, TESTMODE 1 stressing or other reliability testing must be repeated 8 times.

Charge gain tests can also be made by monitoring the VT inreases after extended high temperature bakes and/or stresses on unprogrammed cells.

Note that the VERIFY mode can also be used to detect more dramatic VT changes (i.e. chages in VT that will cause a complete change in the output logic state in the VERIFY mode).

PRELOAD MODE

The Preload Mode is entered by raising Pin 9 to Vhh. This causes the output driver to be tri-stated and forces the feedback multiplexer to get data from the I/O pad (independent of Architecture Selection). Thus, the normal feedback path (from the D-Flip-Flop in this case) is disabled and Pad feedback is enabled. The inputs to the AND array are now all directly controlled by Input and I/O pads. The Preload condition is latched on a high-to-low transistion of the Clock (Pin 1). This frees up Pin 9 to be an input to the AND array.

The inputs to the AND Array act essentially like the "present-state" of a state machine. The output from the AND-OR array is the "next-state". When the Clock makes its transition from low-to-high, the "next-state" is captured by the D Flip-Flop. Simultaneously, the output is enabled allowing the "next-state" to propagate to the Output.

The Preload mode allows the testing of an EP300 configured as a synchronous state machine by allowing external inputs to completely determine the "present-state". This allows fast and complete testing of all state transitions.

Although the present invention has been described in terms of a preferred embodiment, it will be appreciated that other alterations and modifications may be apparent to those skilled in the art. It is therefore intended that the following claims be interpreted as covering all such alterations and modifications as fall within the true spirit and scope of the invention.

What is claimed is:

1. A programmable logic array device comprising:
    means forming a first programmable AND array having a plurality of memory cells arranged in addressable rows and columns and which can be individually programmed to contain logic data;
    first input circuit means for receiving a first input signal and for developing a first buffered signal corresponding thereto;
    first row driver means responsive to said first buffered signal and operative to interrogate a particular row of said memory cells and to cause said first AND array to output signals corresponding to the data contained therein;
    first sensing means for sensing the signals output by said first AND array and for developing a corresponding first data signal which is the logicial OR of the signals output by said first AND array;
    first signal storage means for receiving and temporily storing said first data signal;
    first output terminal means; and
    first switching means responsive to a control signal and operative to couple either said first data signal or a data signal temporarily stored in said first signal storage means to said first output terminal means.

2. A programmable logic array device as recited in claim 1 and further comprising second row driver means responsive to a signal input thereto and operative to interrogate another particular row of said memory cells and to cause said first AND array to output other data signals corresponding to the data contained therein to said first sensing means for developing another data signal.

3. A programmable logic array device as recited in claim 2 wherein said memory cells are formed using EPROM technology.

4. A programmable logic array device as recited in claim 2 wherein said memory cells are formed using EEPROM technology.

5. A programmable logic array device as recited in claim 2 wherein said first switching means is also operative to couple either the data signal output by said first sensing means or a data signal temporarily stored in said first signal storage means into said second row driver means.

6. A programmable logic array device as recited in claim 5 wherein said first switching means includes an output multiplexing device for connecting either the output of said first sensing means or the temporarily stored first data signal contained in said first storage means to said first output terminal means.

7. A programmable logic array device as recited in claim 6 wherein said first switching means further includes a feedback multiplexing circuit operative to couple either the output of said first sensing means, the temporarily stored first data signal, or the data appearing at said first output terminal means to said second row driver means.

8. A programmable logic array device as recited in claim 7 wherein said input circuit means includes a level shifting inverter circuit comprising:
    means forming an input terminal for receiving a voltage signal having first and second states;
    a level shifting inverter stage including,
        a first switching element coupled between a voltage source and a first circuit node, said first switching element being responsive to said voltage signal and operative to switch between a conducting state when said voltage signal is in said first state and a non-conducting state when said voltage signal is in said second state,
        a resistive impedence means coupling said first switching element to said voltage source,
        a capacitive impedance means coupled between the junction of said resistive impedance means and said first switching element and circuit ground,
        a second switching element coupled between said first circuit node and circuit ground, said second switching element being responsive to said voltage signal and operative to switch between a non-conducting state when said voltage signal is in said first state and a conducting state when said voltage signal is in said second state;
    means forming an inverter circuit output terminal; and
    buffer means coupling said first circuit node to said inverter circuit output terminal wherein said resistive impedance means assists in the switching of said first switching element from said conducting state to said non-conducting state, and wherein said capacitive impedance means serves to improve the switching speed of said first switching element as it switches from said non-conducting state to said conducting state.

9. A programmable logic array device as recited in claim 8 wherein said first row driver means includes a tri-state driver circuit comprising:
    means forming a circuit input terminal for receiving said buffered signal, and a circuit output terminal;
    a first field effect transistor means responsive to a buffered signal of a first signal state applied to said circuit input terminal and operative to couple said circuit output terminal to a source of potential of a first voltage, said first transistor means having its well region normally connected to said first source of potential;
    a second field effect transistor means responsive to a buffered signal of a second signal state applied to said circuit input terminal and operative to couple said circuit output terminal to circuit ground;
    gating means responsive to operating mode signals and operative to selectively disable said first and second transistor means; and
    a switching device responsive to a first control signal and operative to couple said well region of said first transistor means to a second source of potential of a second voltage substantially greater in magnitude than said first voltage whereby said circuit output terminal may be driven by another signal source to a signal level greater than said first voltage.

10. A programmable logic array device as recited in claim 2 and further comprising additional row driver means responsive to aditional signals input thereto and operative to interrogate other particular rows of said memory cells and to cause said first AND array to output other data signals corresponding to the data contained therein to said first sensing means.

11. A programmable logic array device as recited in claim 1 wherein said input circuit means includes a level shifting inverter circuit comprising:
    means forming an input terminal for receiving a voltage signal having first and second states;
    a level shifting inverter stage including,
        a first switching element coupled between a voltage source and a first circuit node, said first switching element being responsive to said voltage signal and operative to switch between a conducting state when said voltage signal is in said first state and a non-conducting state when said voltage signal is in said second state,
        a resistive impedence means coupling said first switching element to said voltage source,
        a capacitive impedance means coupled between the junction of said resistive impedance means and said first switching element and circuit ground,
        a second switching element coupled between said first circuit node and circuit ground, said second switching element being responsive to said voltage signal and operative to switch between a non-conducting state when said voltage signal is in said first state and a conducting state when said voltage signal is in said second state;
    means forming an inverter circuit output terminal; and
    buffer means coupling said first circuit node to said inverter circuit output terminal wherein said resistive impedance means assists in the switching of said first switching element from said conducting state to said non-conducting state, and wherein said capacitive impedance means serves to improve the switching speed of said first switching element as it switches from said non-conducting state to said conducting state.

12. A programmable logic array device as recited in claim 11 wherein said first switching element is a P- channel field effect transistor and said second switching element is an N-channel field effect transistor.

13. A programmable logic array device as recited in claim 12 wherein said buffer means includes a second inverter stage coupling said first circuit node to a second circuit node.

14. A programmable logic array device as recited in claim 13 wherein said second inverter stage includes a third switching elements responsive to the voltage level on said first node and operative to either couple said second node to or to decouple said second node from said voltage source, and a fourth switching element responsive to the voltage level on said first node and operative to either decouple said second node from or to couple said second circuit node to said circuit ground.

15. A programmable logic array device as recited in claim 14 wherein said third and fourth switching elements are field effect transistors of opposite conductivity types.

16. A programmable logic array device as recited in claim 15 wherein said buffer means further includes a third inverter stage coupling said second circuit node to said inverter circuit output terminal.

17. A programmable logic array device as recited in claim 1 wherein said first row driver means includes a tri-state driver circuit comprising:
means forming a circuit input terminal for receiving said buffered signal, and a circuit output terminal;
a first field effect transistor means responsive to a buffered signal of a first signal state applied to said circuit input terminal and operative to couple said circuit output terminal to a source of potential of a first voltage, said first transistor means having its well region normally connected to said first source of potential;
a second field effect transistor means responsive to a buffered signal of a second signal state applied to said circuit input terminal and operative to couple said circuit output terminal to circuit ground;
gating means responsive to operating mode signals and operative to selectively disable said first and second transistor means; and
a switching device responsive to a first control signal and operative to couple said well region of said first transistor means to a second source of potential of a second voltage substantially greater in magnitude than said first voltage whereby said circuit output terminal may be driven by another signal source to a signal level greater than said first voltage.

18. A programmable logic array device as recited in claim 17 wherein said first transistor means is a P-channel device and said second transistor means is an N-channel device, and said gating means includes an inverter and a switching transistor responsive to a second control signal, said inverter being operative to invert said buffered signal and said switching transistor being operative to couple the inverted signal to the gate of said P-channel transistor, and a NOR gate responsive to a third control signal and said buffered signal and coupled between said circuit input terminal and the gate of said N-channel transistor.

19. A programmable logic array device as recited in claim 1 and further comprising:
means forming a second programmable AND array having a plurality of memory cells arranged in addressable rows and columns and which can be individually programmed to contain logic data;
second input circuit means for receiving a second input signal and for developing a second buffered signal corresponding thereto;
second row driver means responsive to said second buffered signal and operative to interrogate a first particular row of said second AND array memory cells and to cause said second AND array to output signals corresponding to the data contained therein;
second sensing means for sensing the signals output by said second AND array and for developing a corresponding second data signal which is the logical OR of the signals output by said second AND array;
second signal storage means for receiving and temporily storing said second data signal;
second output terminal means; and
second switching means responsive to a control signal and operative to couple either said second data signal or a data signal temporarily stored in said second signal storage means to said second output terminal means.

20. A programmable logic array device as recited in claim 19 and further comprising third row driver means responsive to a signal input thereto and operative to interrogate another particular row of said memory cells in said second AND array and to cause said second AND array to output other data signals corresponding to the data contained therein to said second sensing means for developing another data signal.

21. A programmable logic array device as recited in claim 20 wherein said first switching means is also operative to couple either the data signal output by said first sensing means or a data signal temporarily stored in said first signal storage means into said third row driver means.

22. A programmable logic array device as recited in claim 21 wherein said first switching means includes an output multiplexing device for connecting either the output of said first sensing means or a data signal temporarily stored in said first storage means to said first output terminal means.

23. A programmable logic array device as recited in claim 22 wherein said first switching means further includes a feedback multiplexing circuit operative to couple either the output of said first sensing means, a data signal temporarily stored in said first signal storage means, or data appearing at said first output terminal means to said third row driver means.

24. A programmable logic array device as recited in claim 23 wherein said memory cells are formed using EPROM technology.

25. A programmable logic array device as recited in claim 24 wherein said memory cells are formed using EEPROM technology.

26. A programmable logic array device as recited in claim 23 wherein said input circuit means includes a level shifting inverter circuit comprising:
means forming an input terminal for receiving a voltage signal having first and second states;
a level shifting inverter stage including,
a first switching element coupled between a voltage source and a first circuit node, said first switching element being responsive to said voltage signal and operative to switch between a conducting state when said voltage signal is in said first state and a non-conducting state when said voltage signal is in said second state, a resistive impedance means coupling said first switching element to said voltage source, a capacitive impedance means coupled between the junction of said resistive impedance means and said first switching element and circuit ground, a second switching element coupled between said first circuit node and circuit ground, said second switching element being responsive to said voltage signal and operative to switch between a non-conducting state when said voltage signal is in said first state and a conducting state when said voltage signal is in said second state;

means forming an inverter circuit output terminal; and buffer means coupling said first circuit node to said inverter circuit output terminal wherein said resistive impedance means assists in the switching of said first switching element from said conducting state to said non-conducting state, and wherein said capacitive impedance means serves to improve the switching speed of said first switching element as it switches from said non-conducting state to said conducting state.

27. A programmable logic array device as recited in claim 23 wherein said first row driver means includes a tri-state driver circuit comprising:

means forming a circuit input terminal for receiving said buffered signal, and a circuit output terminal;

a first field effect transistor means responsive to a buffered signal of a first signal state applied to said circuit input terminal and operative to couple said circuit output terminal to a source of potential of a first voltage, said first transistor means having its well region normally connected to said first source of potential;

a second field effect transistor means responsive to a buffered signal of a second signal state applied to said circuit input terminal and operative to couple said circuit output terminal to circuit ground;

gating means responsive to operating mode signals and operative to selectively disable said first and second transistor means; and a switching device responsive to a first control signal and operative to couple said well region of said first transistor means to a second source of potential of a second voltage substantially greater in magnitude than said first voltage whereby said circuit output terminal may be driven by another signal source to a signal level greater than said first voltage.

* * * * *

UNITED STATES PATENT AND TRADEMARK OFFICE
CERTIFICATE OF CORRECTION

PATENT NO.     : B1 4,617,479
DATED          : September 21, 1993
INVENTOR(S)    : Hartmann et al.

It is certified that error appears in the above-identified patent and that said Letters Patent is hereby corrected as shown below:

Column 4, line 8, replace "EEPROM" with - -EPROM- -.

Column 8, line 67, between "first data signal" and "an input signal" insert - -and- -.

Signed and Sealed this

Fifteenth Day of May, 2001

NICHOLAS P. GODICI

Attest:

Attesting Officer    Acting Director of the United States Patent and Trademark Office

REEXAMINATION CERTIFICATE (2093rd)
United States Patent [19]
Hartmann et al.

[11] B1 4,617,479
[45] Certificate Issued Sep. 21, 1993

[54] PROGRAMMABLE LOGIC ARRAY DEVICE USING EPROM TECHNOLOGY

[75] Inventors: Robert F. Hartmann, San Jose; Sau-Ching Wong, Hillsborough; Yiu-Fai Chan, Saratoga; Jung-Hsing Ou, Sunnyvale, all of Calif.

[73] Assignee: Altera Semiconductor Corp., San Jose, Calif.

Reexamination Request:
No. 90/002,916, Dec. 31, 1992

Reexamination Certificate for:
Patent No.: 4,617,479
Issued: Oct. 14, 1986
Appl. No.: 607,018
Filed: May 3, 1984

[51] Int. Cl.$^5$ .............. G06F 7/00; H03K 19/177; H03K 19/20; H03K 19/094
[52] U.S. Cl. .................. 307/465; 307/468; 307/473; 307/475; 340/825.83; 364/716; 364/927.8; 364/929.1; 364/942.8; 364/947; 364/947.2; 364/948.1; 364/949; 364/965; 364/965.5; 364/965.76; 364/965.77; 364/DIG. 2; 365/185; 395/800
[58] Field of Search ............... 307/465, 468, 473, 475, 307/469; 340/825.83; 364/716, 900; 365/94, 103, 104, 184, 185

[56] References Cited

U.S. PATENT DOCUMENTS

| | | |
|---|---|---|
| 3,818,252 | 6/1974 | Chilba et al. |
| 3,987,287 | 10/1976 | Cox et al. |
| 4,091,359 | 5/1978 | Rossler |
| 4,124,899 | 11/1978 | Birkner et al. |
| 4,132,979 | 1/1979 | Heeren |
| 4,177,452 | 12/1979 | Balasubramanian et al. |
| 4,237,542 | 12/1980 | Cukier |
| 4,268,908 | 5/1981 | Logue et al. |
| 4,281,398 | 7/1981 | McKenny et al. |
| 4,283,784 | 8/1981 | Horan |
| 4,313,106 | 1/1982 | Hsu |
| 4,336,601 | 6/1982 | Tanaka |
| 4,366,393 | 12/1982 | Kasuya |
| 4,380,804 | 4/1983 | Lockwood et al. |
| 4,409,683 | 10/1983 | Woodward |
| 4,415,818 | 11/1983 | Ogawa et al. |
| 4,422,072 | 12/1983 | Cavlan |
| 4,458,163 | 7/1984 | Wheeler et al. |
| 4,488,246 | 12/1984 | Brice |
| 4,490,812 | 12/1984 | Guterman |
| 4,495,427 | 1/1985 | Cartwight, Jr. |
| 4,503,520 | 3/1985 | Kyomasu et al. |
| 4,508,977 | 4/1985 | Page et al. |
| 4,524,428 | 6/1985 | Grinberg et al. |
| 4,524,430 | 6/1985 | Page |
| 4,532,607 | 7/1985 | Uchida |
| 4,546,273 | 10/1985 | Osman |
| 4,617,649 | 10/1986 | Kyomasu et al. |
| 4,644,353 | 2/1987 | Wei |
| 4,684,830 | 8/1987 | Tsui et al. |
| 4,717,912 | 1/1988 | Harvey et al. |
| 4,761,768 | 8/1988 | Turner et al. |
| 4,774,421 | 9/1988 | Hartmann et al. |
| 4,870,302 | 9/1989 | Freeman |

FOREIGN PATENT DOCUMENTS

| | | |
|---|---|---|
| 0055348 | 7/1982 | European Pat. Off. |
| 3047186 | 9/1981 | Fed. Rep. of Germany |
| 57-15533 | 1/1982 | Japan |
| 1444084 | 7/1976 | United Kingdom |

OTHER PUBLICATIONS

Kitson et al., *Electronic Design*, 31(25):95–98, 100, 102, (Dec. 1983) "Programmable Logic Chip Rivals Gate Arrays in Flexibility".

"Programmable Array Logic—PAL20RA10," published by Monolithic Memories, copyright 1978, pp. 1–15.

R. A. Wood, "High-Speed Dynamic Programmalbe Logic Array Chip," *IBM Journal of Research and Development*, issued 1975 (Armonk, N.Y.), see pp. 379–383 and Fig. 1.

Hsieh et al., "Electrically Alterable Programmable Logic Array (EAPLA)," International Electron Devices Meeting, *IEDM Technical Digest*, Dec. 8–10, 1980, pp. 598–601.

J. Evans, et al. "Correction of Memory with Defective

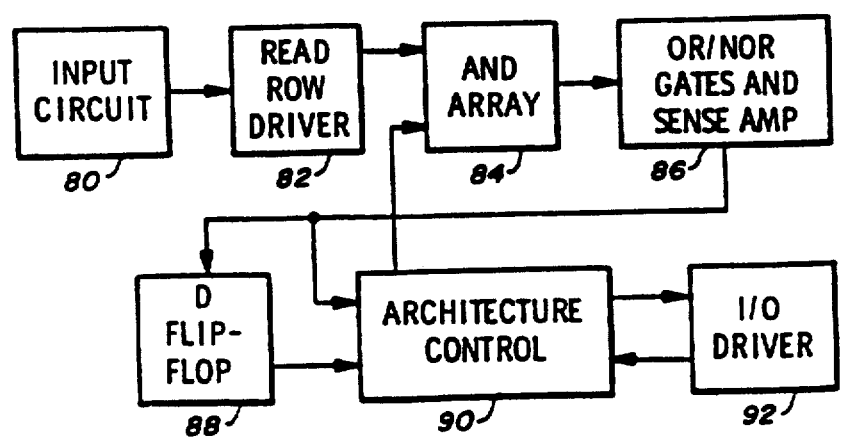

Bits," *IBM Technical Disclosure Bulletin*, 7(6):436–437 (1964).

B. Boggs, et al. "Timing Circuits," *IBM Technical Disclosure Bulletin*, 9(12):1795–1796 (1967).

P. J. Krick, "Complementary MNOS Electronically Alterable Read-Only Memory," *IBM Technical Disclosure Bulletin*, 13(1):263–264 (1970).

Kent Andres, "MOS Programmable Logic Arrays," *A Texas Instruments Application Report*, CA-158:1–4 (1970).

G. D. Shenton, "Custon Design of a High Performance MOST Multiplexer," *Proceedings I.R.E.E. Australia*, 32(6):204–213 (1971).

Carr et al., MOS/LSI Design and Application, Chapter 8:229–258, McGraw-Hill Book Company, *Texas Instruments Electronics Series* (1972).

J. E. Elliott, et al., "Array Logic Processing," *IBM Technical Disclosure Bulletin*, 16(2):586–587 (1973).

H. Fleisher, et al., "Reconfigurable Machine," *IBM Technical Disclosure Bulletin*, 16(10):3342–3344 (1974).

D. L. Wilder, et al., "Multiple Selective Write Alterable Read-Only Storage," *IBM Technical Disclosure Bulletin*, 17(9):2594–2595 (1975).

S. DasGupta, "Array Logic Structure Using FAMOS Devices," *IBM Technical Disclosure Bulletin*, 17(10):2897–2899 (1975).

J. W. Jones, "Array Logic Macros," *IBM Journal of Research and Development*, pp. 120–126 (1975).

H. Fleisher, et al., "an Introduction to Array Logic," *IBM Journal of Research and Development*, pp. 98–105 (1975).

J. C. Logue, et al., "Hardware Implementation of a Small System in Programmable Logic Arrays," *IBM Journal of Research and Development*, pp. 110–119 (1975).

J. W. Jones, "Asynchronous Sequential Control Using Programmable Logic Arrays," *IBM Technical Disclosure Bulletin*, 18(3):826–829 (1975).

Cavlan et al., "Field-PLAs Simplify Logic Designs," *Electronic Design*, 18:84–90 (1975).

K. Horninger, "A High-Speed ESFI SOS Programmable Logic Array With an MNOS Version," *IEEE Journal of Solid-State Circuits*, SC-10(5)331–336 (1975).

L. B. Medwin et al., "Floating Transistor-Gate Field Effect Transistor Memory Device," *RCA Technical Notes*, 1152:1–2 (1976).

N. F. Brickman et al., "Programmable Logic Array Logic Enhancement," *IBM Technical Disclosure Bulletin*, 19(2):583 (1976).

Thomas W. Mitchell, "Programmable Logic Arrays," *Electronic Design*, 15:98–101 (1976).

Eugene R. Hnatek, "Read-Only Memory and Programmable Logic Array," *A. User's Handbook of Semiconductor Memories*, 4:182–356, 308–335 (1977).

L. Ewald et al., "Fusible Link Device," *IBM Technical Disclosure Bulletin*, 19(8):3089–3090 (1977).

A. Scheibe et al., "Technology of a New n-Channel One-Transistor EAROM Cell Called SIMOS," *IEEE Transactions on Electron Devices*, ED24(5):600–606 (1977).

E. H. Stoops, "Programmable Architectural Array," *IBM Technical Disclosure Bulletin*, 19(12):4569 (1977).

L. C. Eggebrecht et al., "Programmable Logic Array with Provision for Interrupts," *IBM Technical Disclosure Bulletin*, 20(2):745–746 (1977).

G. B. Long, "Input Bus Switching for PLA," *IBM Technical Disclosure Bulletin*, 20(3):1062 (1977).

R. Cline, Signetics 82S104/105 FPLA's described in "A Single-Chip Sequential Logic Element," *IEEE Int'l Solid-State Circuits Conf. Dig. of Techn. Papers*, 15–17, pp. 204–205 (1978).

Signetics 82S102/103 and 82S100/101 FPLA's described in Signetics Bipolar & MOS Memory Data Manual, Signetics Corp. (1978).

J. K. Radcliffe, "Fusable Diode Array Circuits," *IBM Technical Disclosure Bulletin*, 21(1):105–108 (1978).

E. Kovacs, "Multiple Matrix Switch: A High Performance Universal Switching System," *International Automatic Testing Conference*, San Diego, Calif, USA, pp. 112–118 (1978).

R. Stewart et al., "16K CMOS/SOS Asynchronous Static RAM," *IEEE International Solid-State Circuits Conference*, pp. 104–106 (1979).

D. G. Grice et al., "Electrically Programmable Logic Array," *IBM Technical Disclosure Bulletin*, 22(10):4621–4622 (1980).

A. Scheibe et al., "A Two-Transistor SIMOS EAROM Cell," *IEEE Journal of Solid-State Circuits*, SC15(3):353–357 (1980).

K. Kokkonen et al., "Redundancy Techniques for Fast Static RAMs," *IEEE International Solid State Circuits Conference*, pp. 80–81 (1981).

Monolithic Memories, *Bipolar LSI Data Book*, pp. 6-2 to 6-13 (1980).

H. H. Chao, "Electrically Alterable Read-Only Memory Array," *IBM Technical Disclosure Bulletin*, 25(1):41-43 (1982).

PAL Programmable Array Logic Handbook, Third Edition, Monolithic Memories, Inc. (1983).

C. Barney et al., "Now a Single Chip Can Hold a Reprogrammable System," *Electronics*, p. 14 (1986).

M. Baker et al., "The PAL20RA10 Story—The Customization of a Standard Product," *IEEE Micro*, pp. 45-60 (1986).

"PEEL 18CV8 CMOS Programmable Electrically Erasable Logic Device," (Preliminary) International CMOS Technology, Inc., (1986).

J. Cho, "25 nsec ICT PEEL 18CV8," Altera Corporation Confidential, (1988).

Advanced Micro Devices, Inc., Sales Brochure, "The World's Most Versatile Logic Tool: AmPAL22V10," (May 1984).

Advanced Micro Devices, Inc. *Programmable Array Logic Handbook*, pp. 2-29 thru 2-40, (1984).

*Primary Examiner*—D. R. Hudspeth

[57] ABSTRACT

The programmable logic array device basically comprises a programmable AND array (FIGS. 5, 11) having a plurality of memory cells (30,31) arranged in addressable rows (40-45) and columns (32-38) and which can be individually programmed to contain logic data; an input circuit (FIG. 9) for receiving an input signal and for developing a buffered signal corresponding thereto; a first row driver (FIG. 10) responsive to the buffered signal and operative to interrogate a particular row of the memory cells and to cause the AND array to output signals corresponding to the data contained therein; first sensing circuitry (FIG. 12) for sensing the signals output by the AND array and for developing corresponding data signals which are the logical OR of signals output by the AND array; first output terminal circuitry; and first switching circuitry (FIG. 14) responsive to a control signal and operative to couple the data signal either into the storage circuitry or to the output terminal circuitry (FIG. 16). The device has the advantages generally of greater logic density and lower system power than standard family logic components.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 11, lines 38–56.

The HH Detect Circuit is shown in FIG. 18. The allowable input values are VIL (VSS≦VIL≦0.8), VIH (2.0≦VIH≦VCC), and VHH (10≦VHH≦VPP). For any input value between VSS and VCC+ [VIP] *VTP*, the P-channel transistor P1 is not conducting. Since the N-channel transistor is always conducting, the voltage at HHDET is pulled to VSS through N1. (Inverters HHN and HH are simply buffers for node HHDET). Thus, the signal at HH is zero whenever the input signal is a normal logic level (VIL or VIH).

If the input signal is raised above VCC+VTP, transistor P1 begins to conduct. Current flows from the input pad thru P1 and N1 to VSS causing a voltage drop across N1. The transistor sizes are adjusted such that when the input signal is greater than 10 volts, [the mode] *the node* HHDET is above the switching threshold of the inverter HHN. Thus, with an input level greater than 10 volts, the output from the second inverter HH, is at a logic 1. The table below shows the situation.

AS A RESULT OF REEXAMINATION, IT HAS BEEN DETERMINED THAT:

Claims 3 and 22 are cancelled.

Claim 1 is determined to be patentable as amended.

Claims 2, 4–21 and 23–27 dependent on an amended claim, are determined to be patentable.

New claims 28–63 are added and determined to be patentable.

1. A [programmable] *reprogrammable* logic array device comprising:
means forming a first programmable AND array having a plurality of *first static, reprogrammable* logic memory cells arranged in addressable rows and columns and which can be individually programmed to contain logic data;
*second static, reprogrammable architecture control memory cells, said second static memory cells being of the same type as said first static memory cells;*
first input circuit means for receiving a first input signal and for developing a first buffered signal corresponding thereto;
first row driver means responsive to said first buffered signal and operative to interrogate a particular row of said memory cells and to cause said first AND array to output signals corresponding to the data contained therein;
first sensing means for sensing the signals output by said first AND array and for developing a corresponding first data signal which is the logical OR of the signals output by said first AND array;
first signal storage means for receiving and temporarily storing said first data signal;
first output terminal means; and
first switching means responsive to a control signal [and] *coupled to and responsive to contents of said second memory cells, said first switching means* operative to couple either said first data signal or a data signal temporarily stored in said first signal storage means to said first output terminal means.

28. *A programmable logic device as recited in claim 1 wherein said first sensing means is a NOR gate that is selectively programmable based on contents of third static, reprogrammable memory cells.*

29. *A programmable logic array device comprising:*
*means forming a first programmable AND array having a plurality of logic memory cells arranged in addressable rows and columns and which can be individually programmed to contain logic data and further comprising architecture control memory cells;*
*first input circuit means for receiving a first input signal and for developing a first buffered signal corresponding thereto;*
*first row driver means responsive to said first buffered signal and operative to interrogate a particular row of said logic memory cells and to cause said first AND array to output signals corresponding to the data contained therein;*
*first sensing means for sensing the signals output by said first AND array and for developing a corresponding first data signal which is the logical OR of the signals output by said first AND array;*
*means for selectively coupling verification sense means to a selected logic memory cell or architecture control memory cell for verification of the programmed state of said selected memory cell, while decoupling other memory cells from said verification sense means;*
*first signal storage means for receiving and temporarily storing said first data signal;*
*first output terminal means; and*
*first switching means responsive to a control signal and operative to couple either said first data signal or a data signal temporarily stored in said first signal storage means to said first output terminal means, said control signal based on the contents of at least one of said architecture control memory cells.*

30. *The programmable logic array as recited in claim 29 wherein said verification sense means is a sense amplifier different from said first sensing means.*

31. *A programmable logic array device as recited in claim 29 wherein said selected memory cell is said architecture control memory cell.*

32. *A programmable logic array device as recited in claim 29 wherein said memory cells are formed using EPROM devices.*

33. *A programmable logic array device as recited in claim 29 wherein said memory cells are formed using EEPROM devices.*

34. *A programmable logic device as recited in claim 29 further comprising means for applying extreme voltages to said memory cells whereby physical integrity of said memory cells may be verified.*

35. The programmable logic device as recited in claim 29 wherein said AND array comprises bit lines coupled to said sensing means, and further comprising means for isolating at least one of said bit lines from said sensing means when said device is being programmed.

36. A reprogrammable logic array device comprising:
means forming a first programmable AND array having a plurality of static, reprogrammable logic memory cells arranged in addressable rows and columns and which can be individually programmed to contain logic data;
a static, programmable architecture control memory cell;
first input circuit means for receiving a first input signal and for developing a first buffered signal corresponding thereto;
first row driver means responsive to said first buffered signal and operative to interrogate a particular row of said memory cells and to cause said first AND array to output signals corresponding to the data contained therein;
first sensing means for sensing the signals output by said first AND array and for developing a corresponding first data signal which is the logical OR of the signals output by said first AND array;
first signal storage means for receiving and temporarily storing said first data signal, operation of said signal storage means controlled by at least a first control signal, said first control signal derived from at least one of said input signals based on contents of at least one signal storage memory cell, said signal storage memory cell being a static, reprogrammable memory cell;
first output terminal means; and
first switching means responsive to a second control signal coupled to and responsive to contents of said architecture control memory cell, said first switching means operative to couple either said first data signal or a data signal temporarily stored in said first signal storage means to said first output terminal means.

37. A programmable logic array device as recited in claim 36 wherein said signal storage means is a D flip flop having a reset signal line coupled to said first control signal.

38. A programmable logic array device as recited in claim 37 wherein said first control signal is a logical function of at least one of said inputs, said logical function selected from the group consisting of invereting, or non-inverting buffered.

39. A programmable logic array device as recited in claim 37 wherein a clock input to said signal storage means is coupled to one of said input signals.

40. A programmable logic array device as recited in claim 37 wherein a clock input to said flip flop is coupled to one of said input signals.

41. A programmable logic array device as recited in claim 36 wherein said output terminal means comprises an output circuit that selectively couples logic output to an output pin, said output circuit coupled to and controlled by a product term from said AND array.

42. A programmable logic array device as recited in claim 36 wherein said output terminal means is adapted to alternately receive input from an input/output pin.

43. A programmable logic array device as recited in claim 36 further comprising a feedback circuit adapted to selectively feed back to an AND input either said first data signal or said data signal temporarily stored.

44. A programmable logic array device as recited in claim 36 wherein said logic memory cells, said architecture control memory cells, and said signal storage cells comprise EEPROM bits.

45. A programmable logic array device as recited in claim 36 wherein said logic memory cells, said architecture control memory cells, and said signal storage cells comprise EEPROM bits.

46. A programmable logic array device comprising:
means forming a programmable AND array having a plurality of logic memory cells arranged in addressable rows and columns and which can be individually programmed to contain logic data;
input circuit means for receiving an input signal and for developing a buffered signal corresponding thereto, said input circuit means comprising a level shifting inverter circuit comprising:
i) means forming an input terminal for receiving a voltage signal having first and second states;
ii) a level shifting inverter stage including:
a first switching element coupled between a voltage source and a first circuit node, said first switching element being responsive to said voltage signal and operative to switch between a conducting state when said voltage signal is in said first state and a non-conducting state when said voltage signal is in said second state;
a resistive impedance means coupling said first switching element to said voltage source;
a capacitive impedance means coupled between the junction of said resistive impedance means and said first switching element and circuit ground; and
a second switching element coupled between said first circuit node and circuit ground, said second switching element being responsive to said voltage signal and operative to switch between a non-conducting state when said voltage signal is in said first state and a conducting state when said voltage signal is in said second state;
iii) means forming an inverter circuit output terminal; and
iv) buffer means coupling said first circuit node to said inverter circuit output terminal wherein said resistive impedance means assists in the switching of said first switching element from said conducting state to said non-conducting state, and wherein said capacitive impedance means serves to improve the switching speed of said first switching element as it switches from said non-conducting state to said conducting state;
first row driver means responsive to said buffered signal and operative to interrogate a particular row of said memory cells and to cause said AND array to output signals corresponding to the data contained therein;
first sensing means for sensing the signals output by said AND array and for developing a corresponding first data signal which is the logical OR of signals output by said AND array;
first signal storage means for receiving and temporarily storing said first data signal;
first output terminal means; and
first switching means responsive to a control signal and operative to couple either said first data signal or said data signal temporarily stored in said first signal storage means to said first output terminal means.

47. A programmable logic array device comprising:
means forming a first programmable AND array having a plurality of logic EEPROM memory cells arranged in addressable rows and columns and which can be individually programmed to contain logic data;

first input circuit means for receiving a first input signal and for developing a first buffered signal corresponding thereto;

first row driver means responsive to said first buffered signal and operative to interrogate a particular row of said EEPROM memory cells and to cause said first AND array to output signals corresponding to the data contained therein;

first sensing means for sensing the signals output by said first AND array and for developing a corresponding first data signal which is the logical OR of the signals output by said first AND array;

first signal storage means for receiving and temporarily storing said first data signal;

first output terminal means;

second row driver means responsive to a signal input thereto and operative to interrogate another particular row of said EEPROM memory cells and to cause said first AND array to output other data signals corresponding to the data contained therein to said first sensing means for developing another data signal; and first switching means responsive to a control signal and operative to couple either said first data signal or a data signal temporarily stored in said first signal storage means to said first output terminal means.

48. A programmable logic array device comprising:

means forming a first programmable AND array having a plurality of logic memory cells arranged in addressable rows and columns and which can be individually programmed to contain logic data;

first input circuit means for receiving a first input signal and for developing a first buffered signal corresponding thereto;

first row driver means responsive to said first buffered signal and operative to interrogate a particular row of said memory cells and to cause said first AND array to output signals corresponding to the data contained therein;

first sensing means for sensing the signals output by said first AND array and for developing a corresponding first data signal which is the logical OR of the signals output by said first AND array;

first signal storage means for receiving and temporarily storing said first data signal;

first output terminal means;

second row driver means responsive to a signal input thereto and operative to interrogate another particular row of said memory cells and to cause said first AND array to output other data signals corresponding to the data contained therein to said first sensing means for developing another data signal; and first switching means responsive to a control signal and operative to couple either said first data signal or a data signal temporarily stored in said first signal storage means to said first output terminal means and also operative to couple either the data signal output by said first sensing means or a data signal temporarily stored in said first signal storage means into said second row driver means, said first switching means further comprising:

i) an output multiplexing device for connecting either the output of said first sensing means or the temporarily stored first data signal contained in said first signal storage means to said first output terminal means; and ii) a feedback multiplexing circuit operative to couple either the output of said first sensing means, the temporarily stored first data signal, or the data appearing at said first output terminal means to said second row driver means.

49. A programmable logic device as recited in claim 48 wherein said feedback multiplexing circuit is adapted to feed back a selected signal to logic inputs without applying said selected signal to an output pin of said programmable logic device.

50. A programmable logic array device comprising:

means forming a first programmable AND array having a plurality of logic memory cells arranged in addressable rows and columns and which can be individually programmed to contain logic data;

first logic input circuit means for receiving a first logic input signal and for developing a first buffered signal corresponding thereto;

first row driver means responsive to said first buffered signal and operative to interrogate a particular row of said memory cells and to cause said first AND array to output signals corresponding to the data contained therein;

first sensing means for sensing the signals output by said first AND array and for developing a corresponding first data signal which is the logical OR of the signals output by said first AND array;

first signal storage means for receiving and temporarily storing said first data signal;

first output terminal means;

first switching means responsive to a control signal and operative to couple either said first data signal or a data signal temporarily stored in said first signal storage means to said first output terminal means; and mode setting means, said mode setting means coupled to a single first selected input pin of said device, said mode setting means selecting between normal operation of said device and a programming mode based on a magnitude of a voltage applied to said first selected input pin, said mode setting means alternately coupling second selected input pins to:

i) an address decoder; and ii) said logic inputs.

51. The device recited in claim 50 wherein said first selected pin is coupled to said logic inputs when said mode setting means selects normal operation.

52. The device recited in claim 51 wherein said mode setting means alternately couples a third selected input pin for data input to said memory cells when said mode setting means selects said programming mode.

53. The programmable logic device as recited in claim 50 wherein said mode setting means further comprises:

a tristate input buffer that is disabled when said second selected input pins are connected to said address decoder; and a tristate address decoder that is disabled when said second selected input pins are connected to said logic inputs.

54. The programmable logic device as recited in claim 53 wherein said tristate address buffer comprises a switching transistor having a well connected to a well bias line, said well bias line switchable between a first state and a second state.

55. A reprogrammable logic array device comprising:

means forming a first programmable AND array having a plurality of logic memory cells arranged in addressable rows and columns and which can be individually programmed to contain logic data, wherein each of said plurality of memory cells comprise first and second MOS transistors coupled in series between first and second nodes, one of said first or second transistors comprising a gate having a substantially time-invariant charge thereon based on a programming input, whereby said first and second transistors cooperate to produce said logic cell data at an output node;

first input circuit means for receiving a first input signal and for developing a first buffered signal corresponding thereto;

first row driver means responsive to said first buffered signal and operative to interrogate a particular row of said memory cells and to cause said first AND array to output signals corresponding to the data contained therein based on said logic cell data;

first sensing means for sensing the signals output by said first AND array and for developing a corresponding first data signal which is the logical OR of the signals output by said first AND array;

first signal storage means for receiving and temporarily storing said first data signal;

first output terminal means; and first switching means responsive to a control signal and operative to couple either said first data signal or a data signal temporarily stored in said first signal storage means to said first output terminal means.

56. The programmable logic device as recited in claim 55 wherein one of said first or second transistors is an EEPROM transistor.

57. A reprogrammable logic array device for operation in a logic system comprising:

means forming a first programmable AND array having a plurality of logic memory cells arranged in addressable rows and columns and which can be individually programmed to contain logic data;

first input circuit means for receiving a first input signal and for developing a first buffered signal corresponding thereto;

first row driver means responsive to said first buffered signal and operative to interrogate a particular row of said memory cells and to cause said first AND array to output signals corresponding to the data contained therein;

first sensing means for sensing the signals output by said first AND array and for developing a corresponding first data signal which is the logical OR of the signals output by said first AND array;

first signal storage means for receiving and temporarily storing said first data signal;

first output terminal means;

first switching means responsive to a control signal and operative to couple either said first data signal or a data signal temporarily stored in said first signal storage means to said first output terminal means; and means in said system for modifying a programmed state of selected memory cells in real time based on selected conditions, whereby said programmable logic array is adaptive to said system.

58. A reprogrammable logic array device comprising:

means forming a first programmable AND array having a plurality of logic first reprogrammable memory cells arranged in addressable rows and columns and which can be individually programmed to contain logic data;

second reprogrammable architecture control memory cells;

first input circuit means for receiving at least first and second input signals from respective first and second input pins, and for developing buffered signals corresponding thereto;

first row driver means responsive to said buffered signals and operative to interrogate a particular row of said memory cells and to cause said first AND array to output signals corresponding to the data contained therein;

first sensing means for sensing the signals output by said first AND array and for developing a corresponding first data signal which is the logical OR of the signals output by said first AND array;

first signal storage means for receiving and temporarily storing said first signal, said first signal storage means comprising a clock input, said clock input coupled to said first input pin;

first output terminal means; and first switching means responsive to a control signal coupled to and responsive to contents of said second memory cells, said first switching means operative to couple either said first data signal or a data signal temporarily stored in said first signal storage means to said first output terminal means.

59. A programmable logic array device comprising:

means forming a first programmable AND array having a plurality of first logic reprogrammable memory cells arranged in addressable rows and columns and which can be individually programmed to contain logic data;

second reprogrammable architecture control memory cells, said second memory cells comprising at least a storage selection memory cell, a feedback control memory cell, and an output control memory cell;

first input circuit means for receiving a first input signal and for developing a first buffered signal corresponding thereto;

first row driver means responsive to said first buffered signal and operative to interrogate a particular row of said memory cells and to cause said first AND array to output signals corresponding to the data contained therein;

first sensing means for sensing the signals output by said first AND array and for developing a corresponding first data signal which is the logical OR of the signals output by said first AND array;

first signal storage means for receiving and temporarily storing said first data signal;

first output terminal means, said output terminal means comprising means selecting whether an output signal is to be supplied to an output pin based on contents of said output control memory cell;

first switching means responsive to a control signal coupled to and responsive to contents of said storage selection memory cell, said first switching means operative to couple either said first data signal or a data signal temporarily stored in said first signal storage means to said first output terminal means; and feedback switching means responsive to contents of said feedback control memory cell and operative to couple or not couple said first data signal to said AND array.

60. A programmable logic device as recited in claim 59 wherein said feedback switching means is further adapted to select between said first data signal and said data signal temporarily stored for feedback to said AND array.

61. A programmable logic device as recited in claim 59 wherein said feedback switching means is further adapted to select between said first data signal an input signal from said output terminal means for input to said AND array.

62. A programmable logic device as recited in claim 59 wherein said feedback switching means is adapted to select between said first data signal, said data signal temporarily stored, and an input signal from said output terminal means for feedback to said AND array.

63. A programmable logic array device comprising:

means forming a first programmable AND array having a plurality of programmable logic memory cells arranged in addressable rows and columns and which can be individually programmed to contain logic data;

a pluality of input pins for receiving logic inputs, a single input pin coupled to each of said logic memory cells and adapted to receive an input of sufficient potential to program each of said logic memory cells;

first input circuit means coupled to said input pins for receiving a first input signal and for developing a first buffered signal corresponding thereto;

first row driver means responsive to said first buffered signal and operative to interrogate a particular row of said memory cells and to cause said first AND array to output signals corresponding to the data contained therein;

first sensing means for sensing the signals output by said first AND array and for developing a corresponding first data signal which is the logical OR of the signals output by said first AND array;

first signal storage means for receiving and temporarily storing said first data signal;

first output terminal means; and first switching means responsive to a control signal and operative to couple either said first data signal or a data signal temporarily stored in said first signal storage means to said first output terminal means.

* * * * *